(12) United States Patent
Elsherbini et al.

(10) Patent No.: US 12,417,978 B2
(45) Date of Patent: Sep. 16, 2025

(54) MICROELECTRONIC ASSEMBLIES HAVING BACKSIDE DIE-TO-PACKAGE INTERCONNECTS

(71) Applicant: Intel Corporation, Santa Clara, CA (US)

(72) Inventors: Adel A. Elsherbini, Tempe, AZ (US); Kimin Jun, Portland, OR (US); Shawna M. Liff, Scottsdale, AZ (US); Johanna M. Swan, Scottsdale, AZ (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 848 days.

(21) Appl. No.: 17/470,189

(22) Filed: Sep. 9, 2021

(65) Prior Publication Data

US 2023/0073026 A1    Mar. 9, 2023

(51) Int. Cl.
*H01L 23/528* (2006.01)
*H01L 23/522* (2006.01)

(52) U.S. Cl.
CPC ...... *H01L 23/5283* (2013.01); *H01L 23/5226* (2013.01)

(58) Field of Classification Search
CPC .............. H01L 23/5283; H01L 23/5226
USPC ....................................................... 257/691
See application file for complete search history.

(56) References Cited

U.S. PATENT DOCUMENTS

| | | | |
|---|---|---|---|
| 11,335,642 B2 * | 5/2022 | Liff | ............... H01L 25/065 |
| 2017/0358560 A1 | 12/2017 | Kim et al. | |
| 2019/0067163 A1 | 2/2019 | Qi et al. | |
| 2020/0091128 A1 | 3/2020 | Elsherbini et al. | |
| 2020/0161244 A1 | 5/2020 | Kao et al. | |
| 2020/0286871 A1 | 9/2020 | Liff et al. | |
| 2021/0167016 A1 | 6/2021 | Lu et al. | |

FOREIGN PATENT DOCUMENTS

CN          113113382 A       7/2021

OTHER PUBLICATIONS

U.S. Appl. No. 17/210,682, filed Mar. 24, 2021, Integrated Circuit Assemblies With Direct Chip Attach to Circuit Boards.
U.S. Appl. No. 17/210,836, filed Mar. 24, 2021, Integrated Circuit Assemblies.

* cited by examiner

*Primary Examiner* — Tu-Tu V Ho
(74) *Attorney, Agent, or Firm* — Akona IP PC

(57) ABSTRACT

Microelectronic assemblies, related devices and methods, are disclosed herein. In some embodiments, a microelectronic assembly may include a first die, having a first surface and an opposing second surface, in a first layer, and including a first metallization stack at the first surface; a device layer on the first metallization stack; a second metallization stack on the device layer; and an interconnect on the first surface of the die electrically coupled to the first metallization stack; a conductive pillar in the first layer; and a second die, having a first surface and an opposing second surface, in a second layer on the first layer, wherein the first surface of the second die is coupled to the conductive pillar and to the second surface of the first die by a hybrid bonding region.

20 Claims, 23 Drawing Sheets

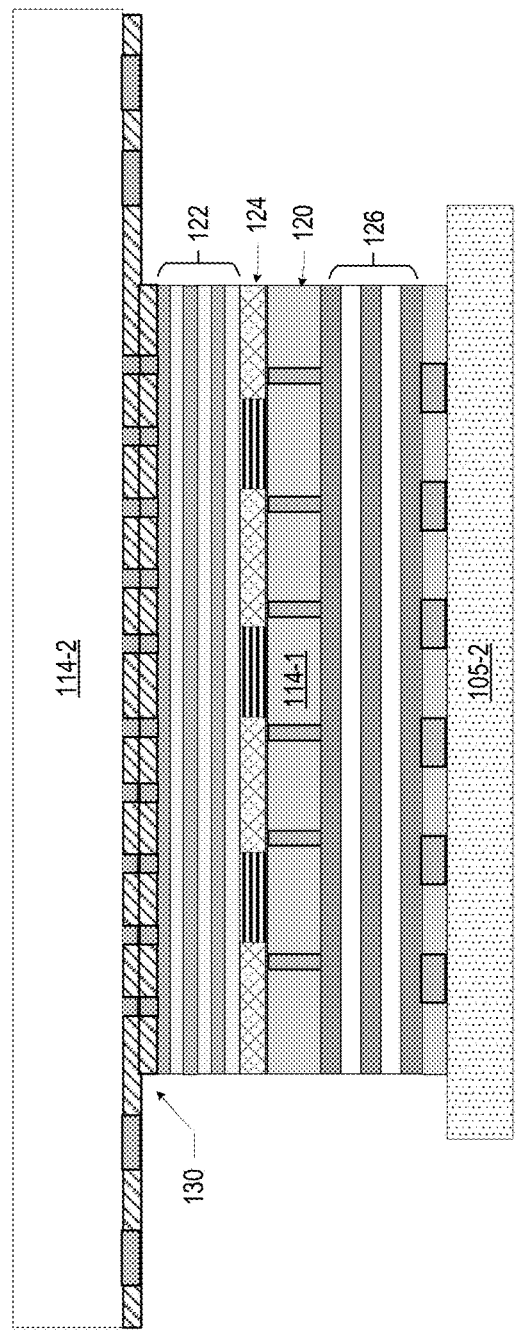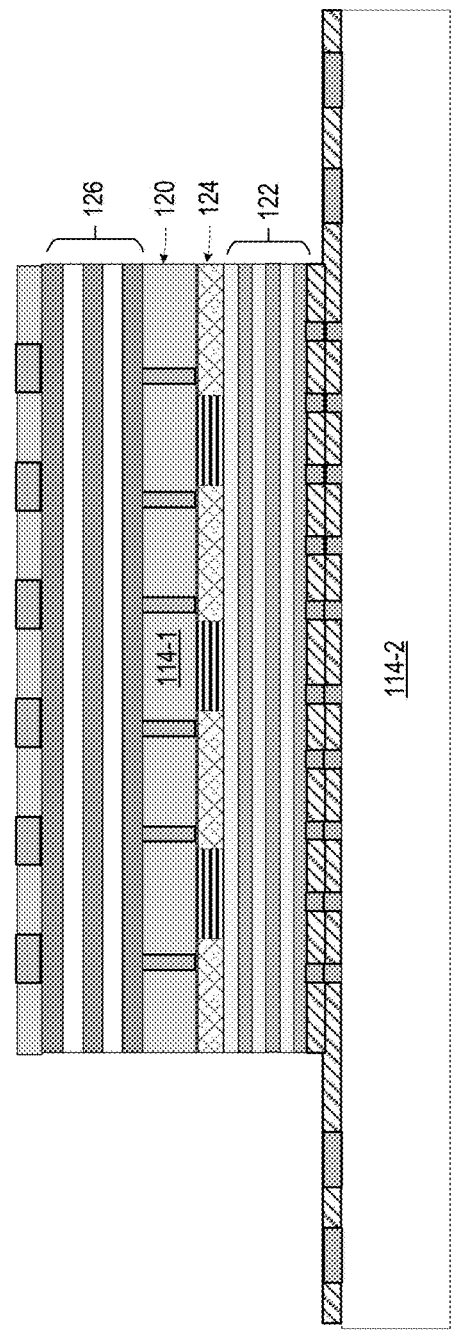

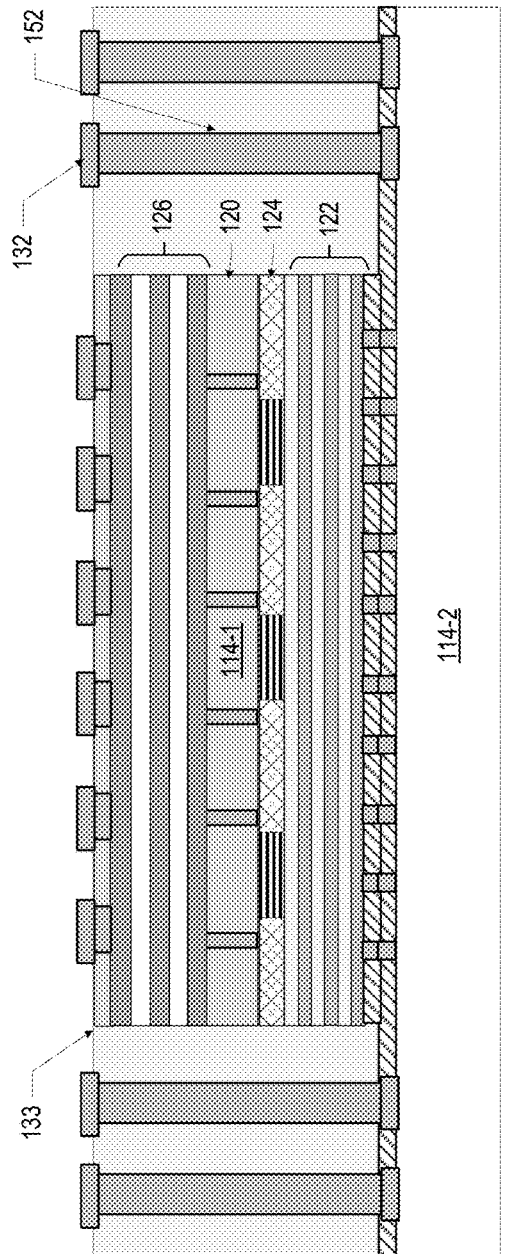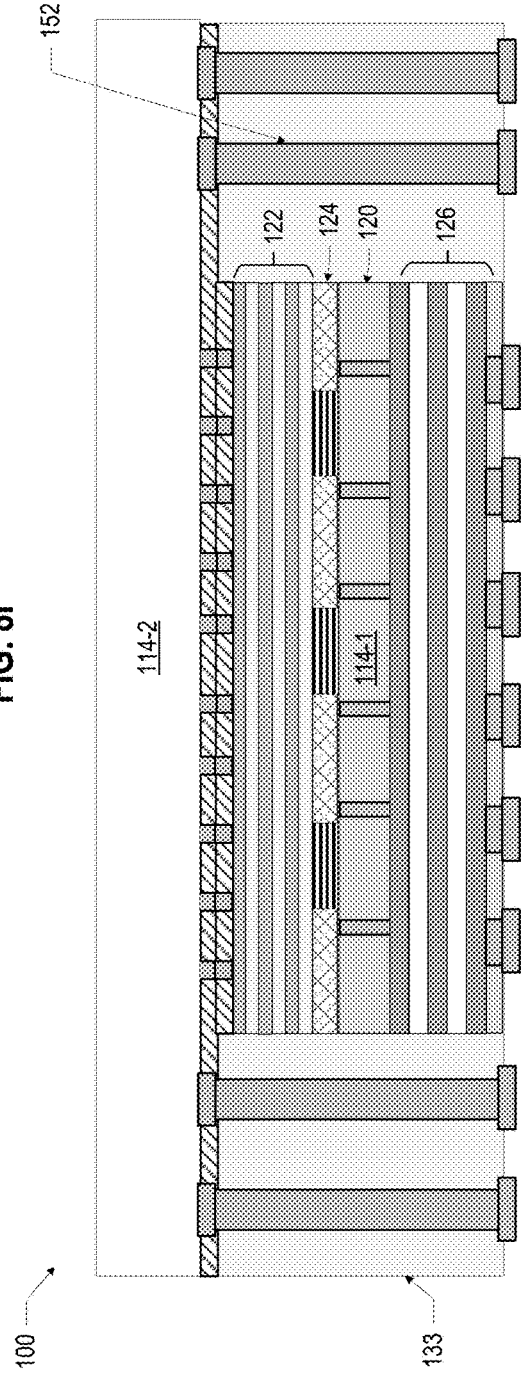

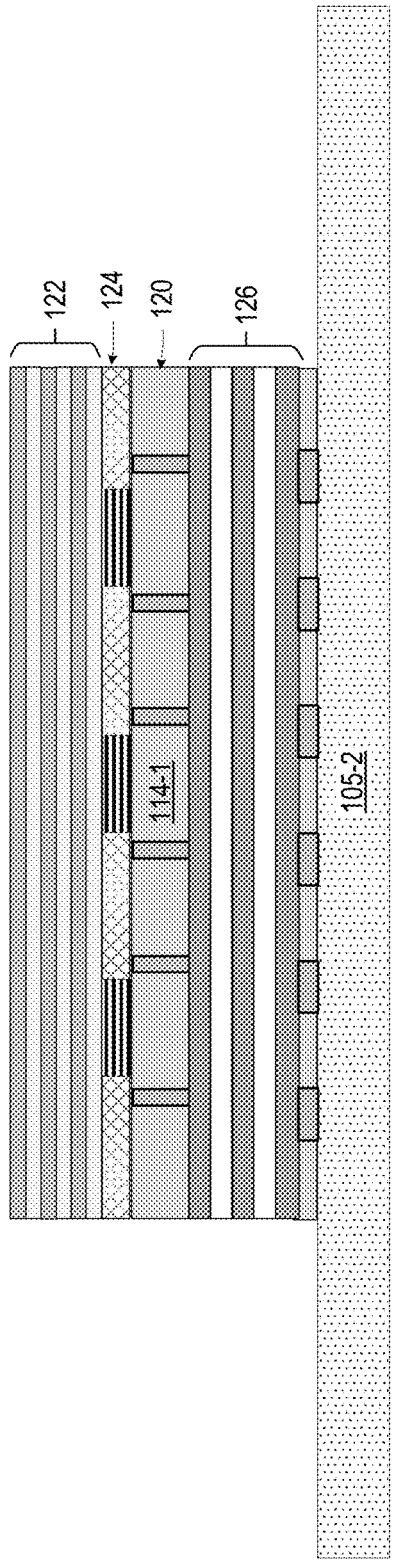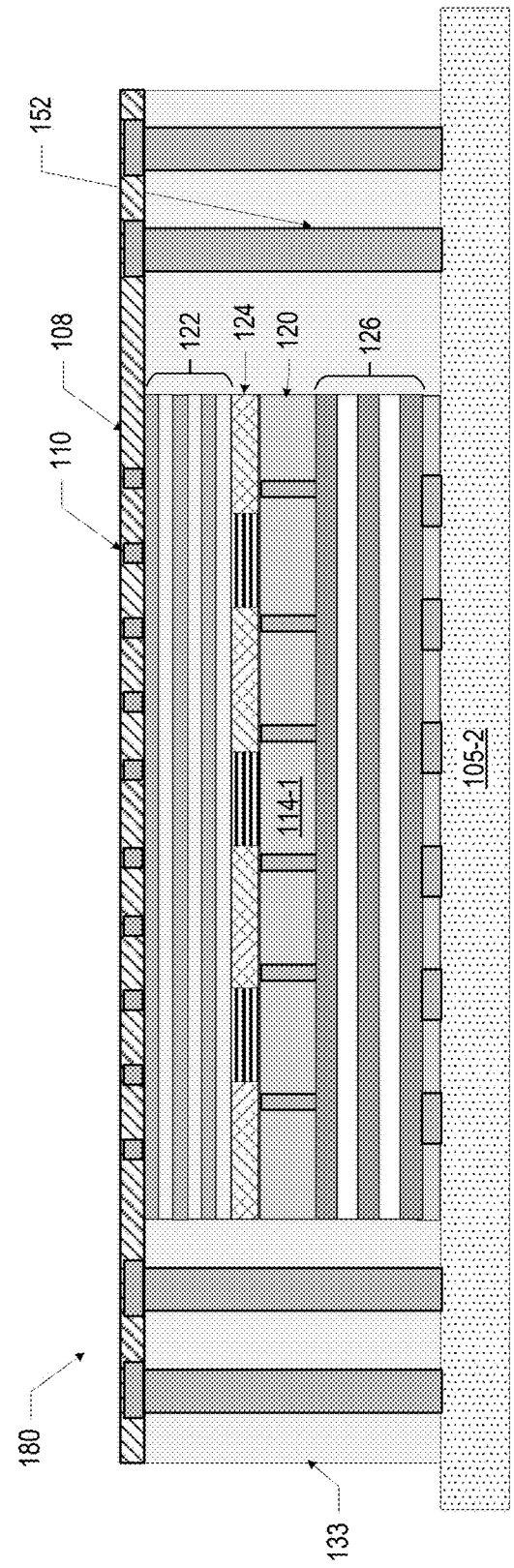

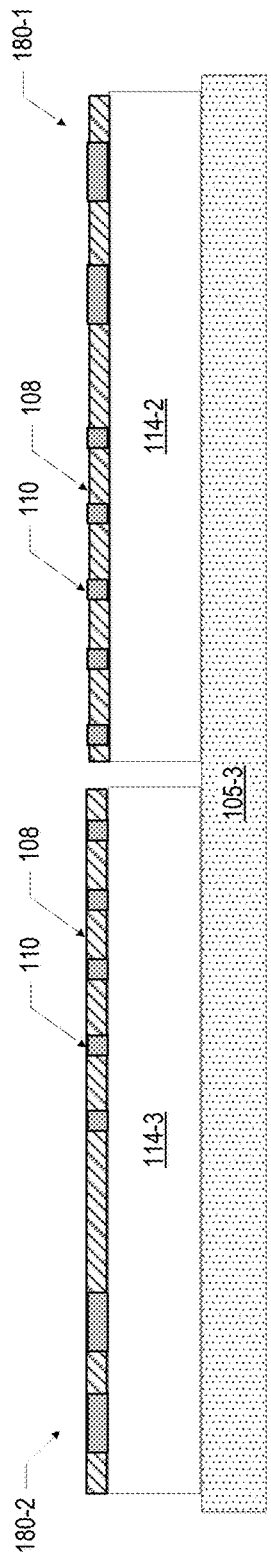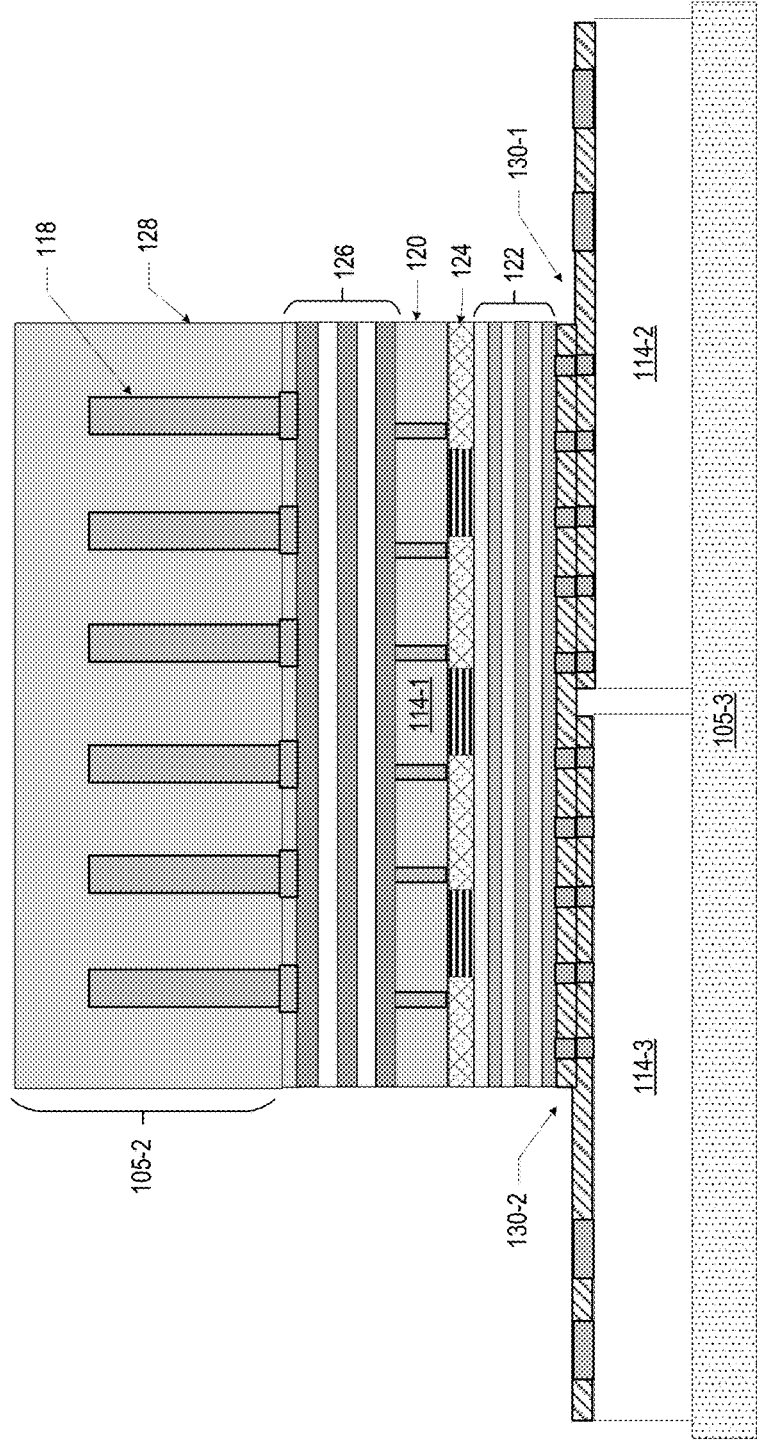
FIG. 10C
FIG. 10D

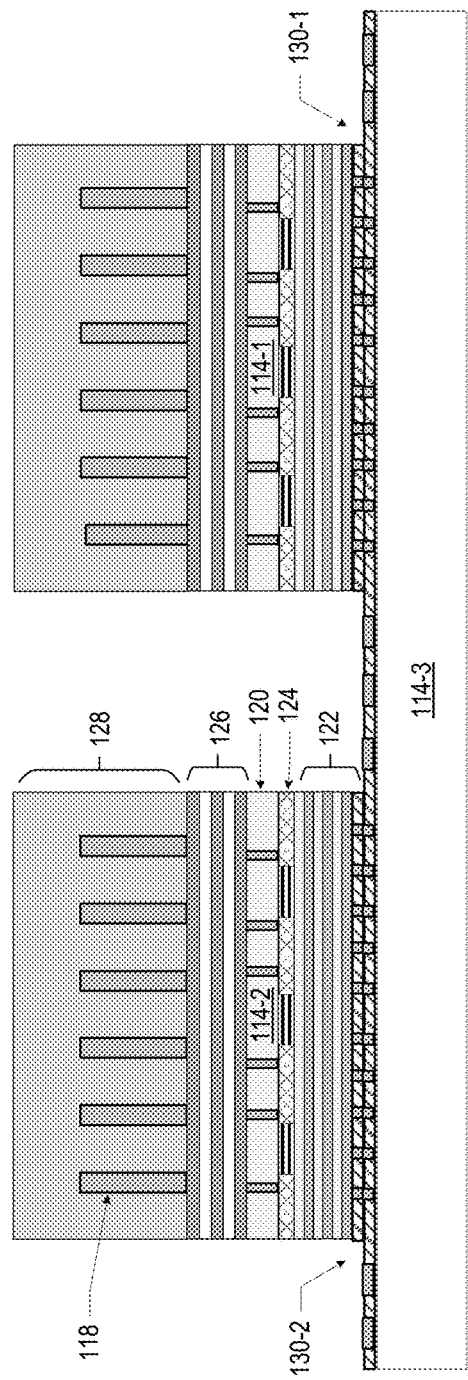
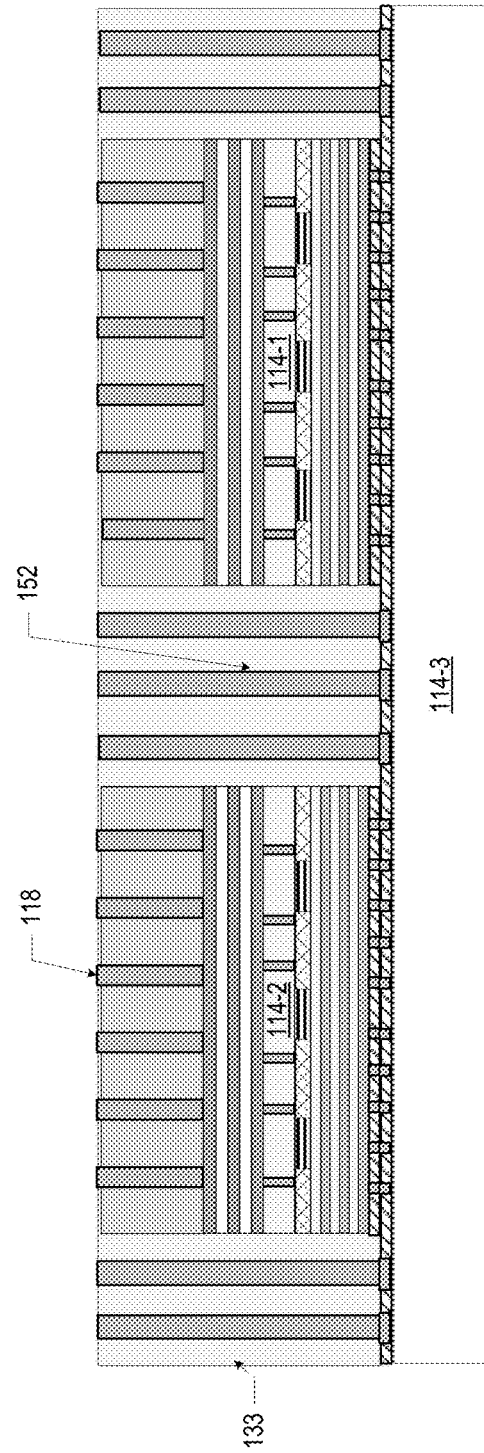
FIG. 11A
FIG. 11B

MICROELECTRONIC ASSEMBLIES HAVING BACKSIDE DIE-TO-PACKAGE INTERCONNECTS

BACKGROUND

For reliable operation of integrated circuit (IC) packages, as well as increased manufacturing assembly yields and reduced costs, IC dies and subassemblies may be tested prior to coupling to a package substrate or to each other so that only known good dies and subassemblies are used.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 8A-8J are side, cross-sectional views of various stages in an example process for manufacturing the microelectronic assembly of FIG. 3, in accordance with various embodiments.

FIGS. 9A-9D are side, cross-sectional views of various stages in an example process for manufacturing the microelectronic assembly of FIG. 1, in accordance with various embodiments.

FIGS. 10A-10G are side, cross-sectional views of various stages in an example process for manufacturing the microelectronic assembly of FIG. 5, in accordance with various embodiments.

FIGS. 11A-11D are side, cross-sectional views of various stages in an example process for manufacturing the microelectronic assembly of FIG. 7, in accordance with various embodiments.

DETAILED DESCRIPTION

Figure 1:
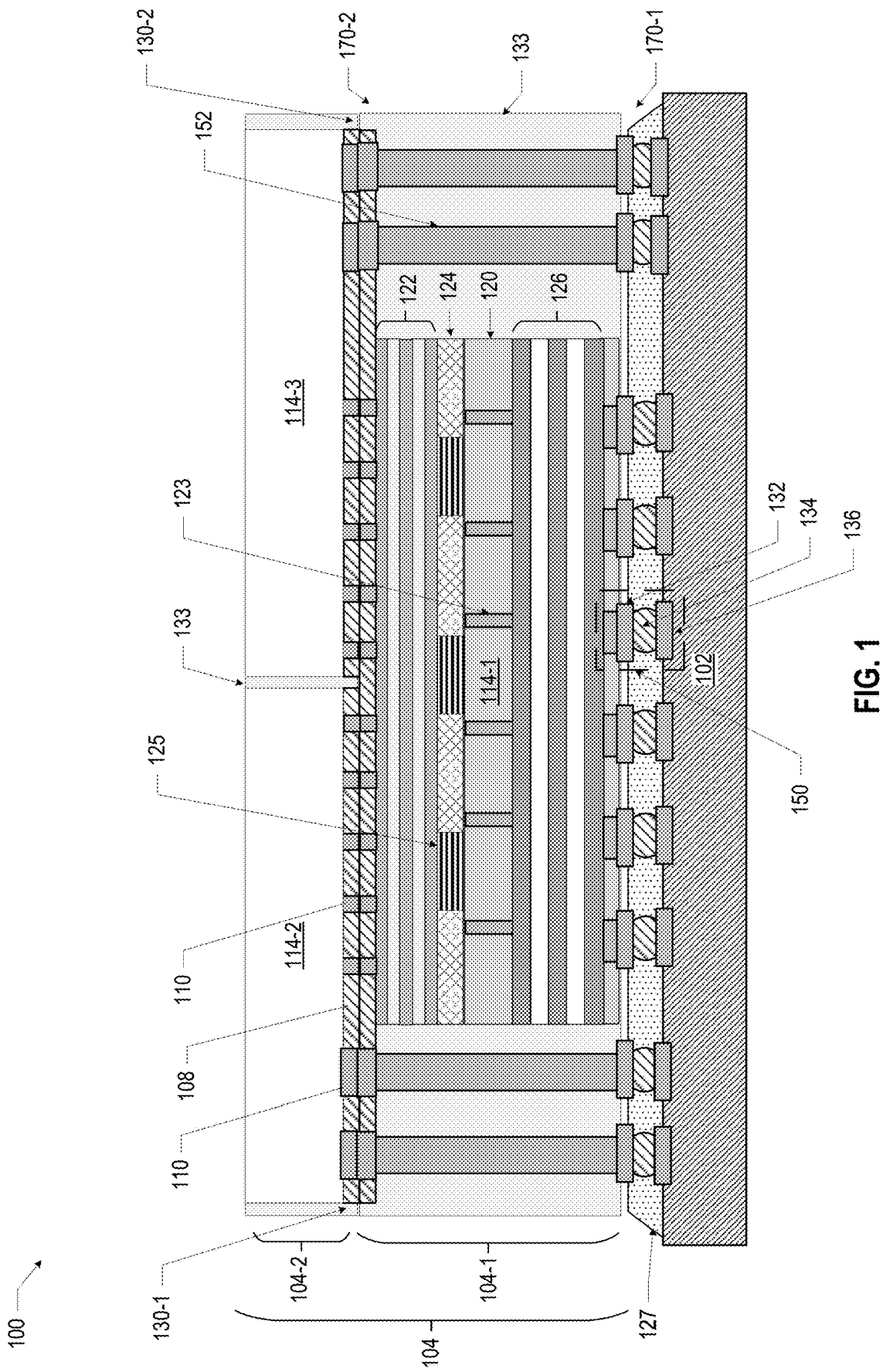
FIG. 1 is a side, cross-sectional view of an example microelectronic assembly, in accordance with various embodiments.

Microelectronic assemblies, related devices and methods, are disclosed herein. For example, in some embodiments, a microelectronic assembly may include a first die, having a first surface and an opposing second surface, in a first layer, and including a first metallization stack at the first surface; a device layer on the first metallization stack; a second metallization stack on the device layer; and a die-to-package interconnect on the first surface of the die electrically coupled to the first metallization stack; a conductive pillar in the first layer; and a second die, having a first surface and an opposing second surface, in a second layer on the first layer, wherein the first surface of the second die is coupled to the conductive pillar and to the second surface of the first die by a hybrid bonding region.

Coupling two or more components by direct bonding in a multi-die IC package is challenging due to the increasingly small size and thickness of such components, the finer pitch of interconnects, and the reduced thickness of the bonding interface between components (e.g., z-height of die-to-die spacing), among others. Conventional methods for testing die functionality (e.g., to identify known good dies (KGD) during manufacturing) include using standard probing techniques to land on die pads. However, once dies are integrated into subassemblies, die pads may not be available for testing until after the subassembly is integrated into an IC package and thick metal layers (e.g., backside connections) are formed for connecting to a circuit board. In one example, a top wafer and a bottom wafer may be manufactured up to the fine pitch bonding layers, the fine pitch bonding layers of the top and bottom wafers may be attached using wafer-to-wafer bonding techniques, then the backside of the bottom wafer may be thinned to reveal TSVs in the bottom die, and thick metal layers may be formed and electrically coupled to the TSVs, which enable testing for functionality. In another example, the fine pitch bonding layers of a top die and a bottom wafer may be attached using die-to-wafer bonding techniques, then the backside of the bottom wafer may be thinned to reveal TSVs in the bottom die, and thick metal layers may be formed and electrically coupled to the TSVs, which enable testing for functionality. In many such cases, when a bad or non-functioning subassembly is attached to a package, the manufacturing defect units and costs are compounded. Various ones of the microelectronic assemblies disclosed herein may exhibit better assembly yields during manufacturing, and improved performance and reliability during use, relative to conventional approaches by providing integrated interconnects to a backside of a die that may be used for testing die functionality in subassemblies. For example, the microelectronic assemblies disclosed herein may enable matching high-performance base dies to high performance top dies to achieve the best possible performance, customizing the backside power grid for each base die to reduce the cost or improve the performance, and separating the requirements on the base die signaling vias (e.g., backside-to-frontside vias) from the base die power delivery vias to optimize performance.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. For convenience, the phrase "FIG. 8" may be used to refer to the collection of drawings of FIGS. 8A-8J, the phrase "FIG. 9" may be used to refer to the collection of drawings of FIGS. 9A-9D, etc. Although certain elements may be referred to in the singular herein, such elements may include multiple sub-elements. For example, "an insulating material" may include one or more insulating materials.

FIG. 1 is a side, cross-sectional view of an example microelectronic assembly, in accordance with various embodiments. The microelectronic assembly 100 may include a multi-layer die subassembly 104 having integrated backside die-to-package (DTP) interconnects 150. As used herein, the term a "multi-layer die subassembly" 104 may refer to a composite die having two or more stacked dielectric layers with one or more dies in each layer, and conductive interconnects and/or conductive pathways connecting the one or more dies, including dies in non-adjacent layers. As used herein, the terms a "multi-layer die subassembly" and a "composite die" may be used interchangeably. As shown in FIG. 1, the multi-layer die subassembly 104 may include a first layer 104-1 having a die 114-1 and conductive pillars 152, and a second layer 104-2 having a die 114-2 and a die 114-3. The first layer 104-1 may include a first surface 170-1 and an opposing second surface 170-2. In particular, the multi-layer die subassembly 104 may include a first die 114-1 in a first dielectric layer 104-1, a second die 114-2 in a second dielectric layer 104-2 coupled to the first die 114-1 by a first hybrid bonding region 130-1, and a third die 114-3 in the second dielectric layer 104-2 coupled to the first die 114-1 by a second hybrid bonding region 130-2. The die 114-1 may include a first metallization stack 126 at a first surface 170-1, a substrate layer 120 on the first metallization stack 126, a device layer 124 having devices 125 on the substrate layer 120, a second metallization stack 122 on the device layer (e.g., at a second surface 170-2), and DTP interconnects 150 at the first surface 170-1 of the die 114-1 coupled to the first metallization stack 126. The first and second metallization stacks 126, 122 may include a plurality of layers that include an insulating material formed in multiple layers and multiple conductive pathways formed through the insulating material. The conductive pathways in the first and second metallization stacks 126, 122 may include conductive traces and/or conductive vias. The first metallization stack 126 may be referred to herein as "backside metal layers," "thick metallization layers," or other like terms, and the second metallization stack 122 maybe be referred to herein as "active side metal layers" or "thin metallization layers," or other like terms, where the conductive structures of the first metallization stack 126 may be thicker than the conductive structures of the second metallization stack 122. The device layer 124 may include active and passive devices (e.g., transistors, diodes, resistors, inductors, and capacitors, among others). In some embodiments, the device layer 124 may include one or more device layers including transistors (e.g., as discussed below with reference to FIG. 13). For example, the device layer 124 may include first and second transistors, where the first transistor may be a p-type metal oxide semiconductor (PMOS) and the second transistor may be an n-type metal oxide semiconductor (NMOS). The substrate layer 120 may include micro-through silicon vias (μTSVs) 123. The μTSVs 123 may connect the first metallization stack 126 to devices 125 in the device layer 124 through the second metallization stack 122. In some embodiments, the μTSVs 123 have a pitch between 0.01 microns and 0.5 microns. In some embodiments, the substrate layer 120 may be omitted.

The die 114-1 may be coupled to the package substrate 102 by the backside DTP interconnects 150. As used herein, the term "backside DTP interconnects" or "DTP interconnects" may include conductive contacts 132 on the multi-layer die subassembly 104 at the first surface 170-1 of the die 114-1 that are coupled to a first metallization stack 126 (e.g., backside metallization layers) of a die 114-1, and may further include solder 134, or other interconnect structures, and may further include conductive contacts 136 on a surface of a substrate (e.g., a silicon or glass interposer, a package substrate 102 or a circuit board (not shown) in the absence of a package substrate 102 between the multi-layer die subassembly 104 and the circuit board). As used herein, a "conductive contact" may refer to a portion of conductive material (e.g., metal) serving as an electrical interface between different components; conductive interconnects may be recessed in, flush with, or extending away from a surface of a component, and may take any suitable form (e.g., a conductive pad or socket, or portion of a conductive line or via). The conductive contacts 132 on the surface of the die 114-1 may further be coupled to conductive pathways in the die 114-1 (e.g., coupled to devices 125 in the device layer 124 through the μTSVs 123 in the substrate layer 120 and/or through the second metallization stack 122). The DTP interconnects 150 may be configured to route power or signals to and from the dies 114 in the multi-layer die subassembly 104 through the conductive contacts 132, the conductive pillars 152, and/or the first metallization stack 126 in die 114-1.

The dies 114-2, 114-3 in the second layer 104-2 may be coupled to the package substrate 102 through the conductive pillars 152 to form multi-level (ML) interconnects. In particular, the dies 114-2, 114-3 may be coupled to the package substrate 102 through the conductive pillars 152, the conductive contacts 132 on the multi-layer die subassembly 104 (e.g., at the first surface 170-1), the solder 134, and the conductive contacts 136 on the package substrate 102. The ML interconnects may be power delivery interconnects or high speed signal interconnects. As used herein, the term "ML interconnect" may refer to an interconnect that includes a conductive pillar between a first component and a second component where the first component and the second component are not in adjacent layers, or may refer to an interconnect that spans one or more layers (e.g., an interconnect between a first die in a first layer and a second die in a third layer, or an interconnect between a package substrate and a die in a second layer). The dies 114 may include other conductive pathways (e.g., including lines and vias) and/or to other circuitry (not shown) coupled to the respective conductive contacts (e.g., conductive contacts 132 on die 114-1 and/or conductive contacts 110 on dies 114-1, 114-2, 114-3).

Figure 2:
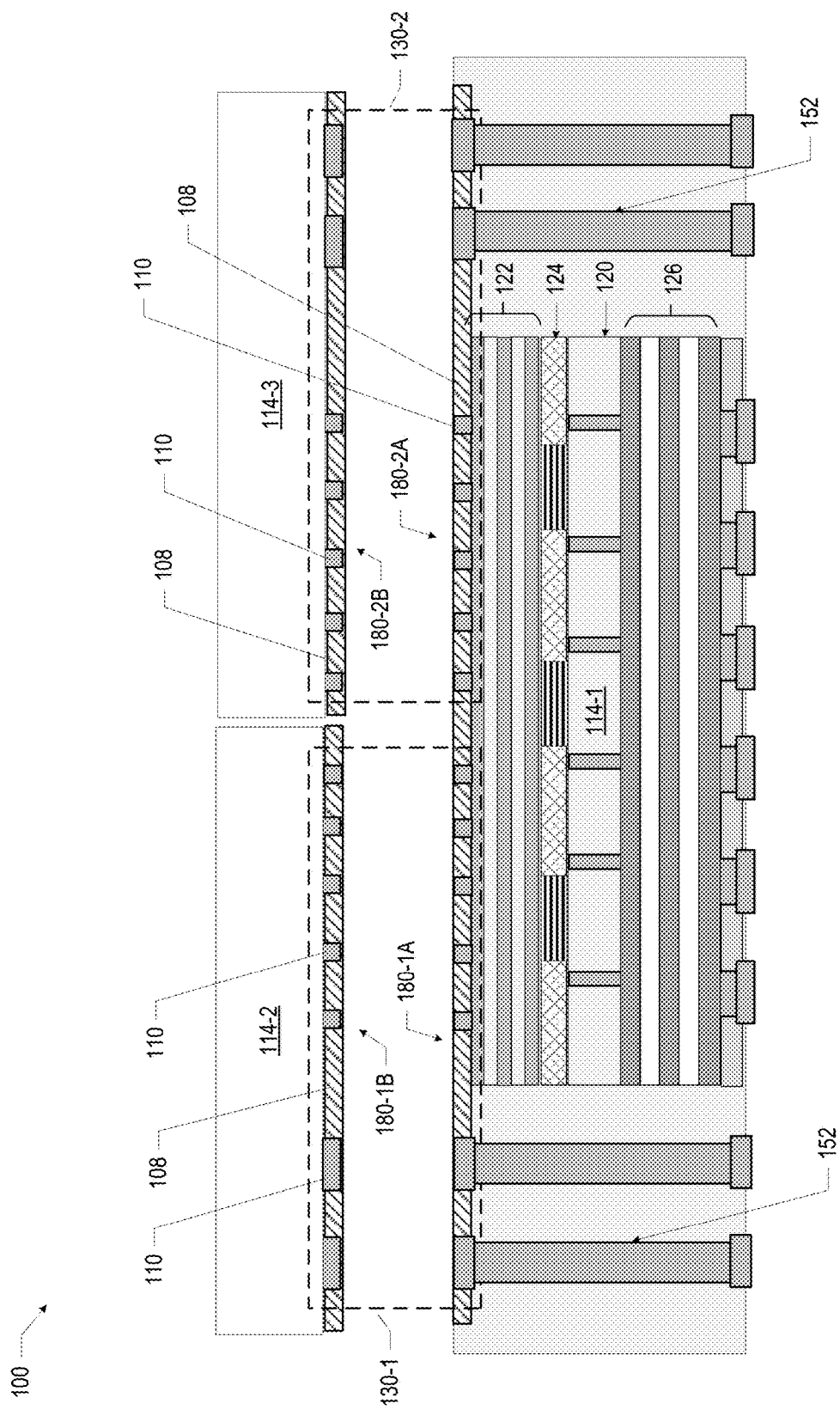
FIG. 2 is a side, cross-sectional exploded view of a portion of the microelectronic assembly of FIG. 1, in accordance with various embodiments.

The microelectronic assembly 100 may include a second die 114-2 coupled to a first die 114-1 by a hybrid bonding (HB) region 130-1. In particular, as illustrated in FIG. 2, the HB region 130-1 may include a HB interface 180-1A at the top surface of the first die 114-1, with the HB interface 180-1A including a set of conductive HB contacts 110 and a HB dielectric 108 around the HB contacts 110 of the HB interface 180-1A. The HB region 130-1 may also include a HB interface 180-1B at the bottom surface of the die 114-2, with the HB interface 180-1B including a set of HB contacts 110 and a HB dielectric 108 around the HB contacts 110 of the HB interface 180-1B. The HB contacts 110 of the HB interface 180-1A of the die 114-1 may align with the HB contacts 110 of the HB interface 180-1B of the die 114-2 so that, in the microelectronic assembly 100, the HB contacts 110 of the die 114-2 are in contact with the HB contacts 110 of the die 114-1. In the microelectronic assembly 100 of FIG. 1, the HB interface 180-1A of the die 114-1 may be bonded (e.g., electrically and mechanically) with the HB interface 180-1B of the die 114-2 to form the HB region 130-1 coupling the die 114-1 and the die 114-2. The second die 114-2 may be further coupled to a conductive pillar 152 by the HB region 130-1.

The microelectronic assembly 100 may further include a third die 114-3 coupled to a first die 114-1 by a hybrid bonding (HB) region 130-2. In particular, as illustrated in FIG. 2, the HB region 130-2 may include a HB interface 180-2A at the top surface of the first die 114-1, with the HB interface 180-2A including a set of conductive HB contacts 110 and a HB dielectric 108 around the HB contacts 110 of the HB interface 180-2A. The HB region 130-2 may also include a HB interface 180-2B at the bottom surface of the die 114-3, with the HB interface 180-2B including a set of HB contacts 110 and a HB dielectric 108 around the HB contacts 110 of the HB interface 180-2B. The HB contacts 110 of the HB interface 180-2A of the die 114-1 may align with the HB contacts 110 of the HB interface 180-2B of the die 114-3 so that, in the microelectronic assembly 100, the HB contacts 110 of the die 114-3 are in contact with the HB contacts 110 of the die 114-1. In the microelectronic assembly 100 of FIG. 1, the HB interface 180-2A of the die 114-1 may be bonded (e.g., electrically and mechanically) with the HB interface 180-2B of the die 114-3 to form the HB region 130-2 coupling the die 114-1 and the die 114-3. More generally, the HB regions 130 disclosed herein may include two complementary HB interfaces 180 bonded together; for ease of illustration, many of the subsequent drawings may omit the identification of the HB interfaces 180 to improve the clarity of the drawings. The third die 114-3 may be further coupled to a conductive pillar 152 by the HB region 130-2. In some embodiments, the second die 114-2 and/or third die 114-3 may not be coupled to a conductive pillar by a HB region. In such instances, the second die 114-2 and/or third die 114-3 may be coupled to a conductive pillar by other interconnects, such as metal-to-metal.

As used herein, the term "hybrid bonding" is used to include techniques in which the HB dielectric 108 of opposing HB interfaces 180 are brought into contact first, then subject to heat and sometimes compression, or techniques in which the HB contacts 110 and the HB dielectric 108 of opposing HB interfaces 180 are brought into contact substantially simultaneously, then subject to heat and compression. In such techniques, the HB contacts 110 and the HB dielectric 108 at one HB interface 180 are brought into contact with the HB contacts 110 and the HB dielectric 108 at another HB interface 180, respectively, and elevated pressures and/or temperatures may be applied to cause the contacting HB contacts 110 and/or the contacting HB dielectrics 108 to bond. HB interconnects may be capable of reliably conducting a higher current than other types of interconnects; for example, some conventional solder interconnects may form large volumes of brittle IMCs when current flows, and the maximum current provided through such interconnects may be constrained to mitigate mechanical failure. Although FIGS. 1 and 2 show the HB dielectric 108 as extending fully along the entire top surface of the first dielectric layer 104-1, the HB dielectric 108 may extend along only a portion of the bottom surfaces of the second and third dies 114-2, 114-3 where the second and third dies 114-2, 114-3 overlap the first die 114-1.

A HB dielectric 108 may include one or more dielectric materials, such as one or more inorganic dielectric materials. For example, a HB dielectric 108 may include silicon and nitrogen (e.g., in the form of silicon nitride); silicon and oxygen (e.g., in the form of silicon oxide); silicon, carbon, and nitrogen (e.g., in the form of silicon carbon nitride); silicon, carbon and oxygen (e.g., in the form of a carbon-doped silicon oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof.

A HB contact 110 may include a pillar, a pad, or other structure. The HB contacts 110, although depicted in the accompanying drawings in the same manner at both HB interfaces 180 of a HB region 130, may have a same structure at both HB interfaces 180, or the HB contacts 110 at different HB interfaces 180 may have different structures. For example, in some embodiments, a HB contact 110 in one HB interface 180 may include a metal pillar (e.g., a copper pillar), and a complementary HB contact 110 in a complementary HB interface 180 may include a metal pad (e.g., a copper pad) recessed in a dielectric. The HB pads also may have different shapes (e.g., a larger regular polygon on a HB interface and a small regular polygon on a complementary HB interface). A HB contact 110 may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). The pad structure also may include a plurality of metals (e.g., may include a high conductivity metal, such as copper or aluminum, capped with a corrosion resistant metal, such as titanium or gold, or a corrosion resistant alloy, such as manganin). In some embodiments, the HB dielectric 108 and the HB contacts 110 of a HB interface 180 may be manufactured using low-temperature deposition techniques (e.g., techniques in which deposition occurs at temperatures below 250 degrees Celsius, or below 200 degrees Celsius), such as low-temperature plasma-enhanced chemical vapor deposition (PECVD).

FIG. 1 also illustrates the die 114-1 coupled to the package substrate 102 by backside DTP interconnects 150. Although FIG. 1 depicts a particular number of dies 114 coupled to the package substrate 102 and to other dies 114 by HB regions 130, this number and arrangement are simply illustrative, and a microelectronic assembly 100 may include any desired number and arrangement of dies 114 coupled to a package substrate 102 and to other dies 114 by HB regions 130. Although a single reference numeral "108" is used to refer to the HB dielectrics of multiple different HB interfaces 180 (and different HB regions 130), this is simply for ease of illustration, and the HB dielectric 108 of different HB interfaces 180 (even within a single HB region 130) may have different materials and/or structures. Similarly, although a single reference numeral "110" is used to refer to the HB contacts of multiple different HB interfaces 180 (and different HB regions 130), this is simply for ease of illustration, and the HB contacts 110 of different HB interfaces 180 (even within a single HB region 130) may have different materials and/or structures.

The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imagable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 13. The conductive pathways in the dies 114 may be bordered by liner materials, such as adhesion liners and/or barrier liners, as suitable. In some embodiments, the die 114 is a wafer. In some embodiments, the die 114 is a monolithic silicon, a fan-out or fan-in package die, or a die stack (e.g., wafer stacked, die stacked, or multi-layer die stacked).

In some embodiments, the die 114 may include conductive pathways to route power, ground, and/or signals to/from other dies 114 included in the microelectronic assembly 100. For example, the die 114-1 may include TSVs, including a conductive material via, such as a metal via, isolated from the surrounding silicon or other semiconductor material by a barrier oxide, or other conductive pathways through which power, ground, and/or signals may be transmitted between the package substrate 102 and one or more dies 114 "on top" of the die 114-1 (e.g., in the embodiment of FIG. 1, the dies 114-2 and/or 114-3). In some embodiments, the die 114-1 may not route power and/or ground to the dies 114-2 and 114-3; instead, the dies 114-2, 114-3 may couple directly to power and/or ground lines in the package substrate 102 by ML interconnects (e.g., through conductive contacts 132 and conductive pillars 152). In some embodiments, the die 114-1 in the first layer 104-1, also referred to herein as "base die," "interposer die," or bridge die," may be thicker than the dies 114-2, 114-3 in the second layer 104-2. In some embodiments, a die 114 may span multiple layers of the multi-layer die subassembly 104 (e.g., may span first and second layers 104-1, 104-2). The die 114-1 of the microelectronic assembly 100 may be a single-sided die (in the sense that the die 114-1 only has conductive contacts on a single surface), or, as shown, may be a double-sided die (in the sense that the die 114-1 has conductive contacts on two surfaces (e.g., a top surface and a bottom surface)), and may be a mixed-pitch die (in the sense that the die 114-1 has sets of conductive contacts with different pitches). In some embodiments, the dies 114-2 and/or 114-3 may not include active devices or routing, and may simply provide thermal and/or mechanical support. In such an embodiment, the HB regions 130-1 and/or 130-2 may not include HB contacts 110. In some embodiments, the dies 114-2, 114-3 may include the elements of the die 114-1 (e.g., a first metallization stack 126, a device layer 124 having devices 125, and a second metallization stack 122). In some embodiments, the die 114-1 may be a memory device (e.g., as described below with reference to the die 1502 of FIG. 12), a high frequency serializer and deserializer (SerDes), such as a Peripheral Component Interconnect (PCI) express. In some embodiments, the die 114-1 may be a processing die, a radio frequency chip, a power converter, a network processor, a workload accelerator, or a security encryptor. In some embodiments, the die 114-2 and/or the die 114-3 may be a processing die.

The multi-layer die subassembly 104 may include an insulating material 133 (e.g., a dielectric material formed in multiple layers, as known in the art) to form the multiple layers and to embed one or more dies in a layer. In some embodiments, the insulating material 133 of the multi-layer die subassembly 104 may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In some embodiments, the die 114 may be embedded in an inhomogeneous dielectric, such as stacked dielectric layers (e.g., alternating layers of different inorganic dielectrics). In some embodiments, the insulating material 133 of the multi-layer die subassembly 104 may be a mold material, such as an organic polymer with inorganic silica particles. The multi-layer die subassembly 104 may include one or more ML interconnects through the dielectric material (e.g., including conductive vias and/or conductive pillars, as shown). The multi-layer die subassembly 104 may have any suitable dimensions. For example, in some embodiments, a thickness of the multi-layer die subassembly 104 may be between 100 um and 2000 um. In some embodiments, the multi-layer die subassembly 104 may be a composite die, such as stacked dies. The multi-layer die subassembly 104 may have any suitable number of layers, any suitable number of dies, and any suitable die arrangement. For example, in some embodiments, the multi-layer die subassembly 104 may have between 3 and 20 layers of dies. In some embodiments, the multi-layer die subassembly 104 may include a layer having between 2 and 50 dies.

The package substrate 102 may include an insulating material (e.g., a dielectric material formed in multiple layers, as known in the art) and one or more conductive pathways to route power, ground, and signals through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the package substrate 102 is formed using standard printed circuit board (PCB) processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable. In some embodiments, the package substrate 102 may be formed using a lithographically defined via packaging process. In some embodiments, the package substrate 102 may be manufactured using standard organic package manufacturing processes, and thus the package substrate 102 may take the form of an organic package. In some embodiments, the package substrate 102 may be a set of redistribution layers formed on a panel carrier by laminating or spinning on a dielectric material, and creating conductive vias and lines by laser drilling and plating. In some embodiments, the package substrate 102 may be formed on a removable carrier using any suitable technique, such as a redistribution layer technique. Any method known in the art for fabrication of the package substrate 102 may be used, and for the sake of brevity, such methods will not be discussed in further detail herein.

In some embodiments, the package substrate 102 may be a lower density medium and the die 114 may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process). In other embodiments, the higher density medium may be manufactured using semiconductor fabrication process, such as a single damascene process or a dual damascene process. In some embodiments, additional dies may be disposed on the top surface of the dies 114-2, 114-3. In some embodiments, additional components may be disposed on the top surface of the dies 114-2, 114-3. Additional passive components, such as surface-mount resistors, capacitors, and/or inductors, may be disposed on the top surface or the bottom surface of the package substrate 102, or embedded in the package substrate 102.

The backside DTP interconnects 150 disclosed herein may take any suitable form. In some embodiments, the backside DTP interconnects 150 may include solder 134 (e.g., solder bumps or balls that are subject to a thermal reflow to form the interconnects), as shown. In some embodiments, the backside DTP interconnects 150 may include an anisotropic conductive material, such as an anisotropic conductive film or an anisotropic conductive paste. An anisotropic conductive material may include conductive materials dispersed in a non-conductive material. The DTP interconnects 150 may be direct metal-to-metal bonding, such as copper-to-copper bonding. In some embodiments, for example, when the package is a silicon interposer, the DTP interconnects 150 may include hybrid bonding.

The microelectronic assembly 100 of FIG. 1 may also include an underfill material 127. In some embodiments, the underfill material 127 may extend between the die 114-1 and the package substrate 102 around the associated backside DTP interconnects 150. The underfill material 127 may be an insulating material, such as an appropriate epoxy material. In some embodiments, the underfill material 127 may include a capillary underfill, non-conductive film (NCF), or molded underfill. In some embodiments, the underfill material 127 may include an epoxy flux that assists with soldering the die 114-1 to the package substrate 102 when forming the backside DTP interconnects 150, and then polymerizes and encapsulates the backside DTP interconnects 150. The underfill material 127 may be selected to have a coefficient of thermal expansion (CTE) that may mitigate or minimize the stress between the multi-layer die subassembly 104 and the package substrate 102 arising from uneven thermal expansion in the microelectronic assembly 100. In some embodiments, the CTE of the underfill material 127 may have a value that is intermediate to the CTE of the package substrate 102 (e.g., the CTE of the dielectric material of the package substrate 102) and a CTE of the multi-layer die subassembly 104.

The microelectronic assembly 100 of FIG. 1 may also include a circuit board (not shown). The package substrate 102 may be coupled to the circuit board by second-level interconnects at the bottom surface of the package substrate 102. The second-level interconnects may be any suitable second-level interconnects, including solder balls for a ball grid array arrangement, pins in a pin grid array arrangement or lands in a land grid array arrangement. The circuit board may be a motherboard, for example, and may have other components attached to it. The circuit board may include conductive pathways and other conductive contacts for routing power, ground, and signals through the circuit board, as known in the art. In some embodiments, the second-level interconnects may not couple the package substrate 102 to a circuit board, but may instead couple the package substrate 102 to another IC package, an interposer, or any other suitable component. In some embodiments, the multi-layer die subassembly 104 may not be coupled to a package substrate 102, but may instead be coupled to a circuit board, such as a PCB.

Many of the elements of the microelectronic assembly 100 of FIG. 1 are included in other ones of the accompanying drawings; the discussion of these elements is not repeated when discussing these drawings, and any of these elements may take any of the forms disclosed herein. Further, a number of elements are illustrated in FIG. 1 as included in the microelectronic assembly 100, but a number of these elements may not be present in a microelectronic assembly 100. For example, in various embodiments, the underfill material 127 and the package substrate 102 may not be included. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP.

Figure 3:
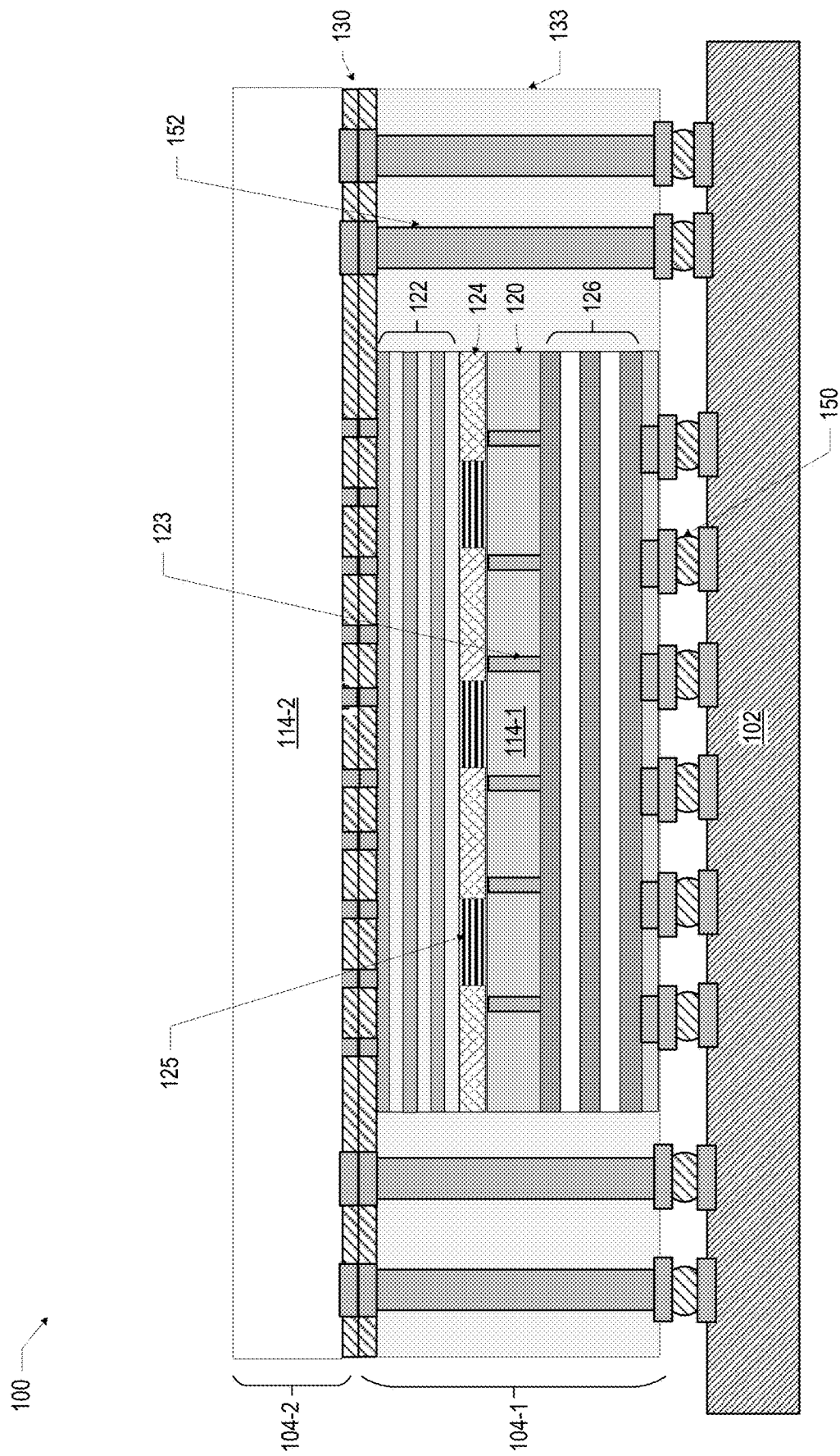
FIG. 3 is a side, cross-sectional view of an example microelectronic assembly, in accordance with various embodiments.

FIG. 3 is a side, cross-sectional view of another example microelectronic assembly, in accordance with various embodiments. The microelectronic assembly 100 may include a multi-layer die subassembly 104 having integrated backside DTP interconnects 150. As shown in FIG. 3, the multi-layer die subassembly 104 may include a first layer 104-1 having a die 114-1 and conductive pillars 152, and a second layer 104-2 having a die 114-2. In particular, the multi-layer die subassembly 104 may include a first die 114-1 in a first dielectric layer 104-1 and a second die 114-2 in a second dielectric layer 104-2 coupled to the first die 114-1 by a first hybrid bonding region 130. The die 114-1 may include a first metallization stack 126 at a first surface 170-1, a substrate layer 120 on the first metallization stack 126, a device layer 124 having devices 125 on the substrate layer 120, a second metallization stack 122 on the device layer (e.g., at a second surface 170-2), and DTP interconnects 150 at the first surface 170-1 of the die 114-1 coupled to the first metallization stack 126. In some embodiments, the substrate layer 120 may be omitted. The die 114-1 may be coupled to the package substrate 102 through the backside DTP interconnects 150 and the die 114-2 in the second layer 104-2 may be coupled to the package substrate 102 by ML interconnects.

Figure 4:
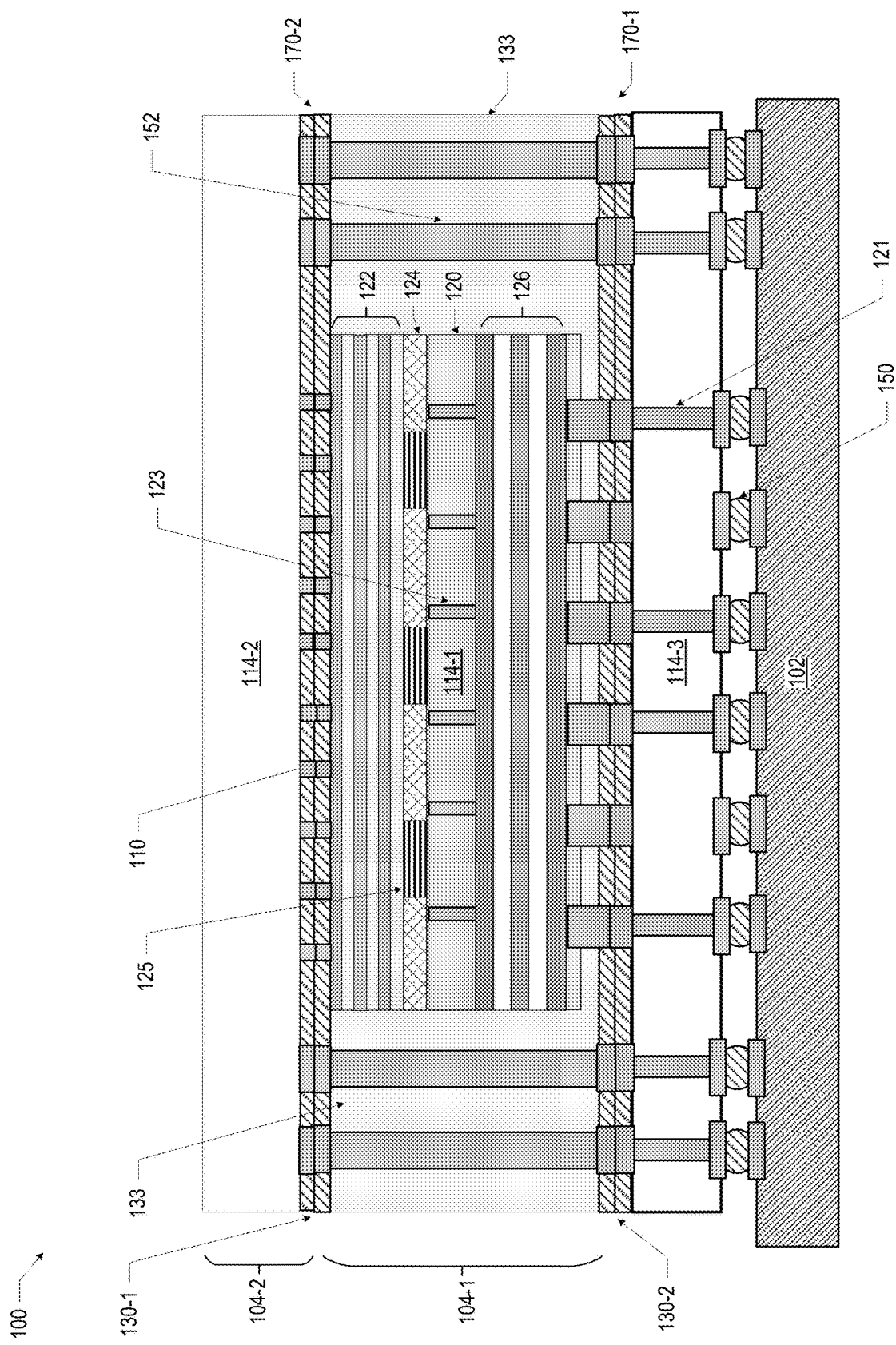
FIG. 4 is a side, cross-sectional view of an example microelectronic assembly, in accordance with various embodiments.

FIG. 4 is a side, cross-sectional view of another example microelectronic assembly, in accordance with various embodiments. The microelectronic assembly 100 may include a multi-layer die subassembly 104 couple to a die 114-3 at a first surface 170-1 and having integrated backside DTP interconnects 150. As shown in FIG. 4, the multi-layer die subassembly 104 may include a first layer 104-1 having a die 114-1 and conductive pillars 152, and a second layer 104-2 having a die 114-2. In particular, the multi-layer die subassembly 104 may include a first die 114-1 in a first dielectric layer 104-1, a second die 114-2 in a second dielectric layer 104-2 coupled to the first die 114-1 by a first hybrid bonding region 130-1, and a third die 114-3 coupled to a first surface 170-1 of the first dielectric layer 104-1 by a second hybrid bonding region 130-2 with DTP interconnects 150 at a bottom surface of the die 114-3. The die 114-1 may include a first metallization stack 126 at a first surface 170-1, a substrate layer 120 on the first metallization stack 126, a device layer 124 having devices 125 on the substrate layer 120, a second metallization stack 122 on the device layer (e.g., at a second surface 170-2). In some embodiments, the substrate layer 120 may be omitted. The die 114-3 may be a double-sided die and may include TSVs 121 and/or other conductive pathways (not shown) for coupling to the package substrate 102 and the multi-layer die subassembly 104. The DTP interconnects 150 at the bottom surface of the die 114-3 may be coupled to the first metallization stack 126 in the die 114-1 by conductive pathways (e.g., TSVs 121) in the die 114-3. The die 114-1 may be coupled to the package substrate 102 through the die 114-3 and the backside DTP interconnects 150 and the die 114-2 in the second layer 104-2 may be coupled to the package substrate 102 through the conductive pillars 152 to form ML interconnects and conductive pathways in the die 114-3. In some embodiments, the die 114-2 may be non-functional and may provide mechanical and/or thermal support. In such an embodiment, the first hybrid bonding region 130-1 may not include HB contacts 110. Further, the die 114-3 may be a passive die including pass-through and redistribution routing.

Figure 5:
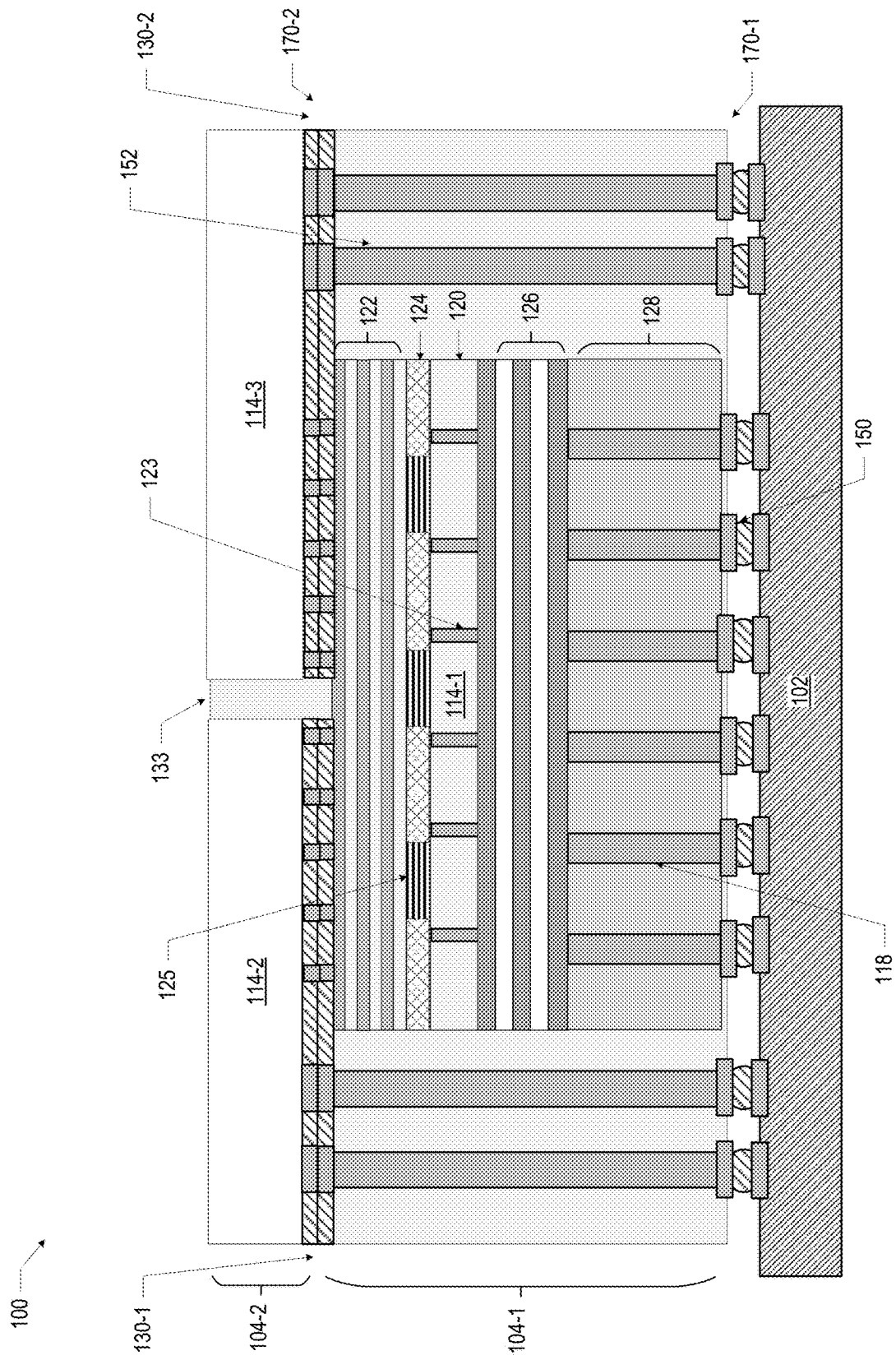
FIG. 5 is a side, cross-sectional view of an example microelectronic assembly, in accordance with various embodiments.

FIG. 5 is a side, cross-sectional view of an example microelectronic assembly, in accordance with various embodiments. The microelectronic assembly 100 may include a multi-layer die subassembly 104 having integrated backside DTP interconnects 150. As shown in FIG. 5, the multi-layer die subassembly 104 may include a first layer 104-1 having a die 114-1 and conductive pillars 152, and a second layer 104-2 having a die 114-2 and a die 114-3. The first layer 104-1 may include a first surface 170-1 and an opposing second surface 170-2. In particular, the multi-layer die subassembly 104 may include a first die 114-1 in a first dielectric layer 104-1, a second die 114-2 in a second dielectric layer 104-2 coupled to the first die 114-1 by a first hybrid bonding region 130-1, and a third die 114-3 in the second dielectric layer 104-2 coupled to the first die 114-1 by a second hybrid bonding region 130-2. The die 114-1 may include a first substrate layer 128 at a first surface 170-1 having TSVs 118, a first metallization stack 126 on the first substrate layer 128, a second substrate layer 120 on the first metallization stack 126, a device layer 124 having devices 125 on the substrate layer 120, a second metallization stack 122 on the device layer (e.g., at a second surface 170-2), and DTP interconnects 150 at the first surface 170-1 coupled to the first metallization stack 126 in the first die 114-1 through the TSVs 118 in the first substrate layer 128. In some embodiments, the TSVs 118 in the first substrate layer 128 may have a pitch between 5 microns and 100 microns. In some embodiments, the second substrate layer 120 may be omitted. The die 114-1 may be coupled to the package substrate 102 through the backside DTP interconnects 150 and the dies 114-2, 114-3 in the second layer 104-2 may be coupled to the package substrate 102 through the ML interconnects.

Figure 6:
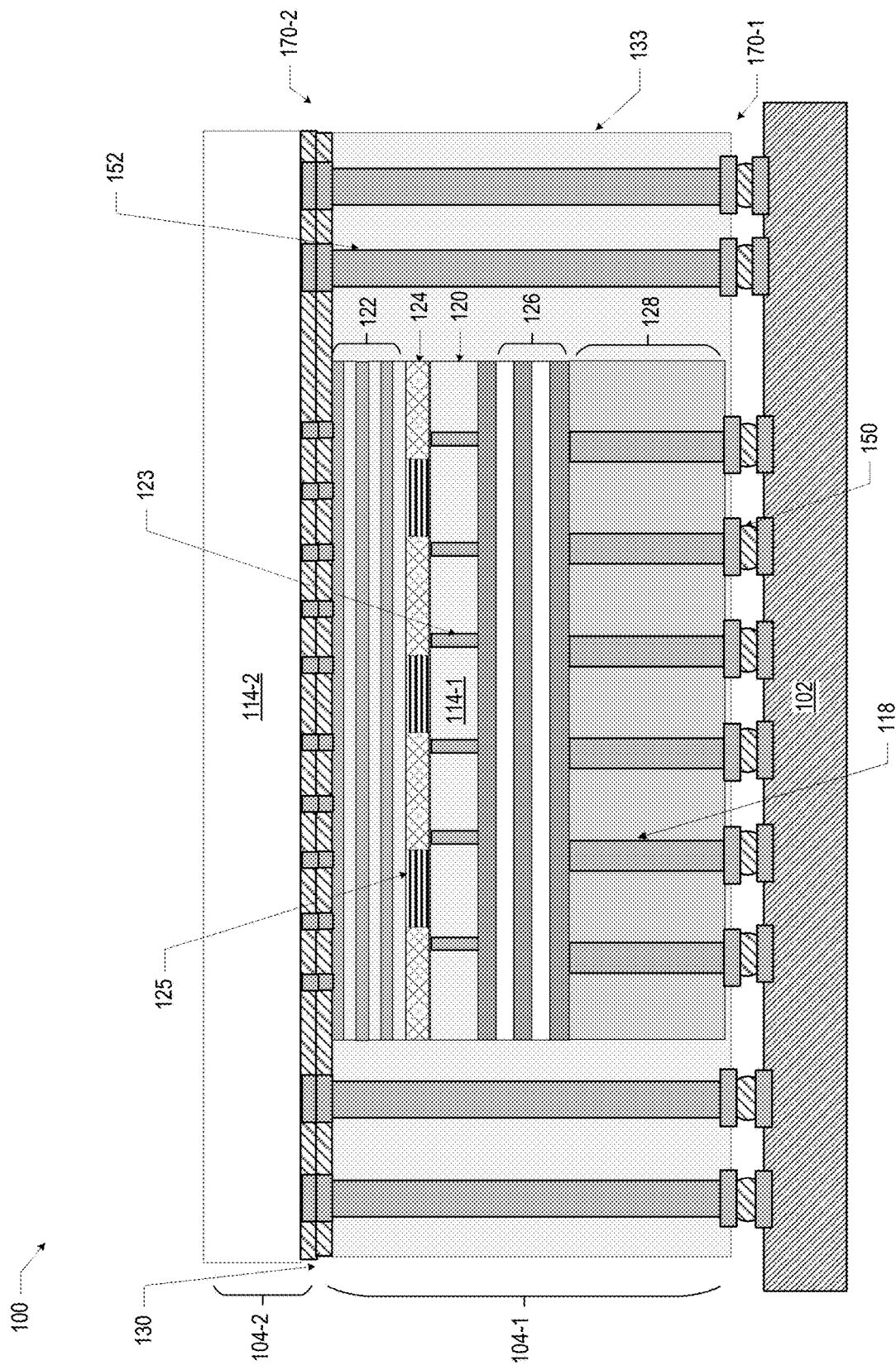
FIG. 6 is a side, cross-sectional view of an example microelectronic assembly, in accordance with various embodiments.

FIG. 6 is a side, cross-sectional view of an example microelectronic assembly, in accordance with various embodiments. The microelectronic assembly 100 may include a multi-layer die subassembly 104 having integrated backside DTP interconnects 150. As shown in FIG. 6, the multi-layer die subassembly 104 may include a first layer 104-1 having a die 114-1 and conductive pillars 152, and a second layer 104-2 having a die 114-2. The first layer 104-1 may include a first surface 170-1 and an opposing second surface 170-2. In particular, the multi-layer die subassembly 104 may include a first die 114-1 in a first dielectric layer 104-1 and a second die 114-2 in a second dielectric layer 104-2 coupled to the first die 114-1 by a hybrid bonding region 130. The die 114-1 may include a first substrate layer 128 at a first surface 170-1 having TSVs 118, a first metallization stack 126 on the first substrate layer 128, a second substrate layer 120 on the first metallization stack 126, a device layer 124 having devices 125 on the substrate layer 120, a second metallization stack 122 on the device layer (e.g., at a second surface 170-2), and DTP interconnects 150 at the first surface 170-1 coupled to the first metallization stack 126 in the first die 114-1 through the TSVs 118 in the first substrate layer 128. In some embodiments, the second substrate layer 120 may be omitted. The die 114-1 may be coupled to the package substrate 102 through the backside DTP interconnects 150 and the die 114-2 in the second layer 104-2 may be coupled to the package substrate 102 through the ML interconnects.

Figure 7:
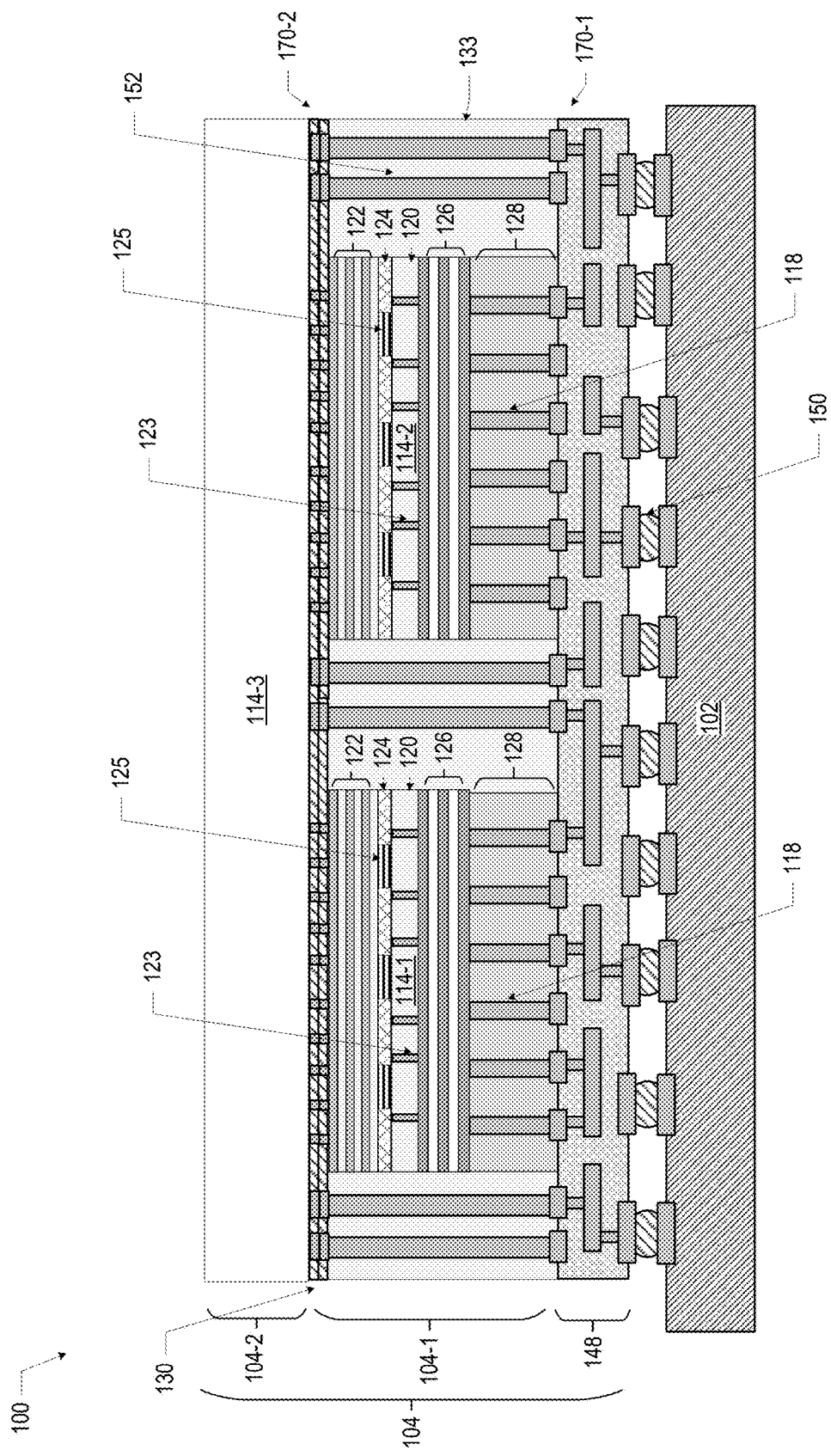
FIG. 7 is a side, cross-sectional view of an example microelectronic assembly, in accordance with various embodiments.

FIG. 7 is a side, cross-sectional view of an example microelectronic assembly, in accordance with various embodiments. The microelectronic assembly 100 may include a multi-layer die subassembly 104 having integrated backside DTP interconnects 150. As shown in FIG. 7, the multi-layer die subassembly 104 may include a redistribution layer (RDL) 148 having DTP interconnects 150 on a bottom surface, a first layer 104-1 on the top surface of the RDL 148, and a second layer 104-2 on the first layer 104-1. The first layer 104-1 may include a first surface 170-1 and an opposing second surface 170-2. In particular, the multi-layer die subassembly 104 may include a first dielectric layer 104-1, the RDL 148 coupled to the first surface 170-1 of the first layer 104-1, and the second dielectric layer 104-2 coupled to the second surface 170-2 of the first dielectric layer 104-1. The first dielectric layer 104-1 may include a first die 114-1, a second die 114-2, and conductive pillars 152 embedded therein and the second dielectric layer 104-2 may include a third die 114-3 embedded therein coupled to the first die 114-1 and the second die 114-2 by a hybrid bonding region 130. The dies 114-1, 114-2 may include a first substrate layer 128 at a first surface 170-1 having TSVs 118, a first metallization stack 126 on the first substrate layer 128, a second substrate layer 120 on the first metallization stack 126, a device layer 124 having devices 125 on the substrate layer 120, a second metallization stack 122 on the device layer (e.g., at a second surface 170-2). In some embodiments, the second substrate layer 120 may be omitted. The first metallization stacks 126 in the respective dies 114-1, 114-2 may be coupled to the DTP interconnects 150 on the bottom surface of the RDL 148 through the TSVs 118 in the first substrate layer 128 and conductive pathways in the RDL 148. The dies 114-1, 114-2 may be coupled to the package substrate 102 through the backside DTP interconnects 150 and the die 114-3 in the second layer 104-2 may be coupled to the package substrate 102 by the DTP interconnects 150 through the conductive pillars 152 of the ML interconnects. Although FIG. 7 shows a particular number and arrangement of a microelectronic assembly 100 including a plurality of embedded first, second, and third dies 114, and a single RDL 148, a microelectronic assembly 100 may include any number and arrangement of dies 114 and RDLs 148, including two or more RDLs 148 and including an RDL 148 at the second surface 170-2 of the first dielectric layer 104-1.

Any suitable techniques may be used to manufacture the microelectronic assemblies 100 disclosed herein. For example, FIGS. 8A-8J are side, cross-sectional views of various stages in an example process for manufacturing the microelectronic assembly 100 of FIG. 3, in accordance with various embodiments. Although the operations discussed below with reference to FIGS. 8A-8J (and others of the accompanying drawings representing manufacturing processes) are illustrated in a particular order, these operations may be performed in any suitable order.

Figure 8A:
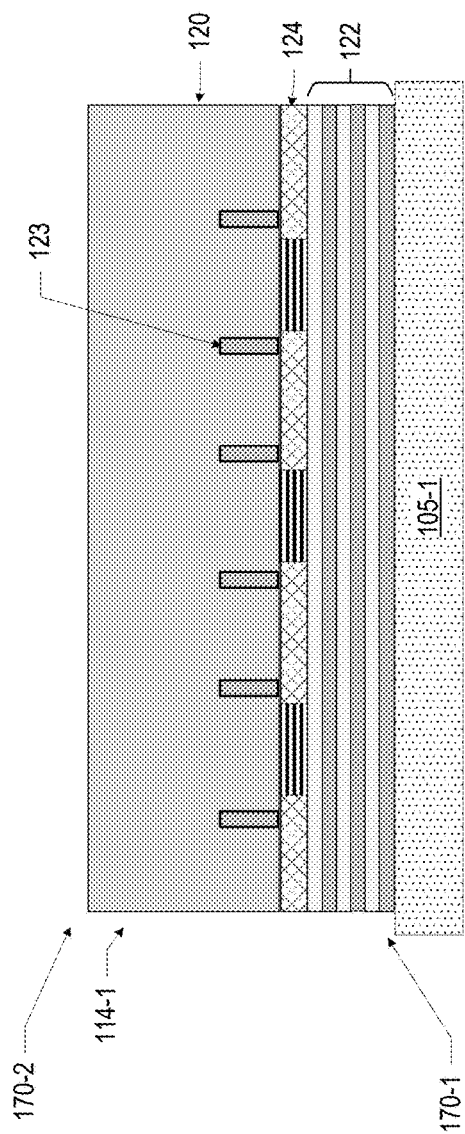

FIG. 8A illustrates an assembly subsequent to placing a first die 114-1 on a first carrier 105-1 with an active surface (e.g., metallization stack 122) facing towards the first carrier 105-1. The first die 114-1 may include an active side metallization stack 122, a device layer 124 having a device 125, and a substrate 120 having a μTSV 123 (e.g., at a backside surface opposing the active surface), where the substrate 120 includes a non-electrical material on and over the μTSV 123. The non-electrical material, which is an inactive portion of the die 114-1, may include silicon, germanium, indium antimonide, lead telluride, indium arsenide, indium phosphide, gallium arsenide, gallium antimonide, further materials classified as group III-V, or an insulating material, such as silicon dioxide (glass), ceramic, or quartz, among other materials. A carrier 105 may include any suitable material, and in some embodiments, may include a semiconductor wafer (e.g., a silicon wafer) or glass (e.g., a glass panel). The first die 114-1 may be attached to the first carrier 105-1 using any suitable technique, including a temporary adhesive layer or a die attach film (DAF).

Figure 8B:
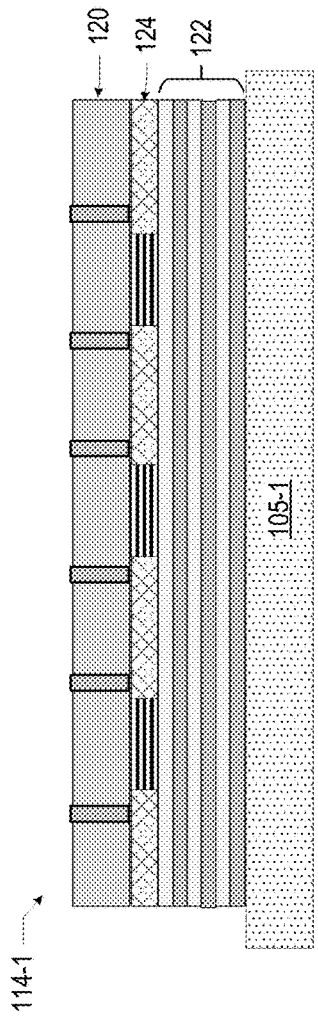

FIG. 8B illustrates an assembly subsequent to removing the non-electrical material from the top surface of the substrate 120 and revealing the top surface of the μTSV 123. The non-electrical material may be removed using any suitable technique, including, for example, grinding, etching, such as reactive ion etching (RIE) or chemical etching. In some embodiments, the top surface of the substrate 120 may be polished to reveal the top surface of the μTSV 123. In some embodiments, when the μTSV 123 are not included in the assembly of FIG. 8A, the μTSV 123 may be formed in the substrate material 120 subsequent to thinning the non-electrical material at the top surface of the substrate 120. In some embodiments, the first die 114-1 may be processed at the wafer level and subsequently singulated.

Figure 8C:
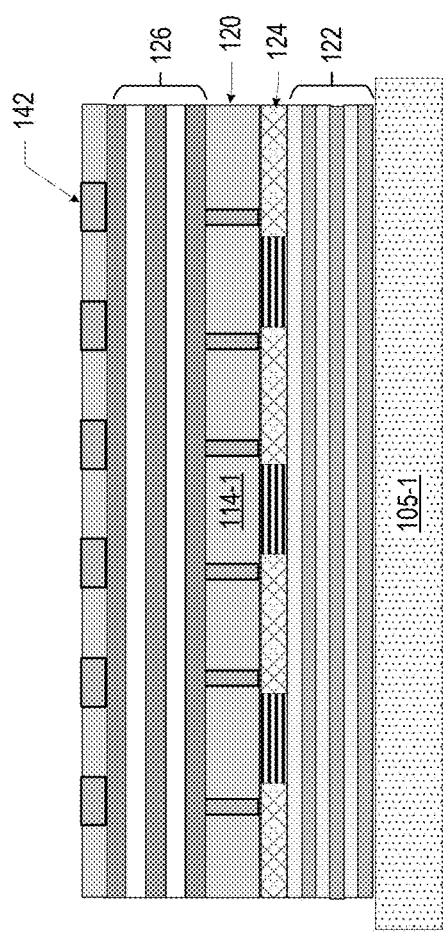

FIG. 8C illustrates an assembly subsequent to forming a backside metallization stack 126 on the top surface of the assembly of FIG. 8B, electrically coupling the backside metallization stack 126 and the active side metallization stack 122 by the μTSV 123 in the substrate 120, and forming conductive pads 142 on the top surface of the backside metallization stack 126. The die 114-1 may be functionally tested using the conductive pads 142 or the top metal layer in the stack 126 to determine that the die 114-1 is a KGD before further processing is performed.

Figure 8D:
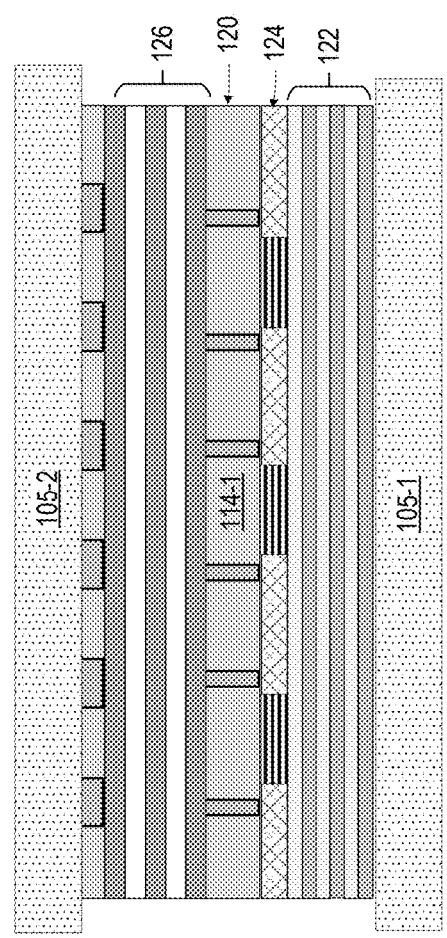

FIG. 8D illustrates an assembly subsequent to mounting a second carrier 105-2 to the top surface of the assembly of FIG. 8C.

Figure 8E:
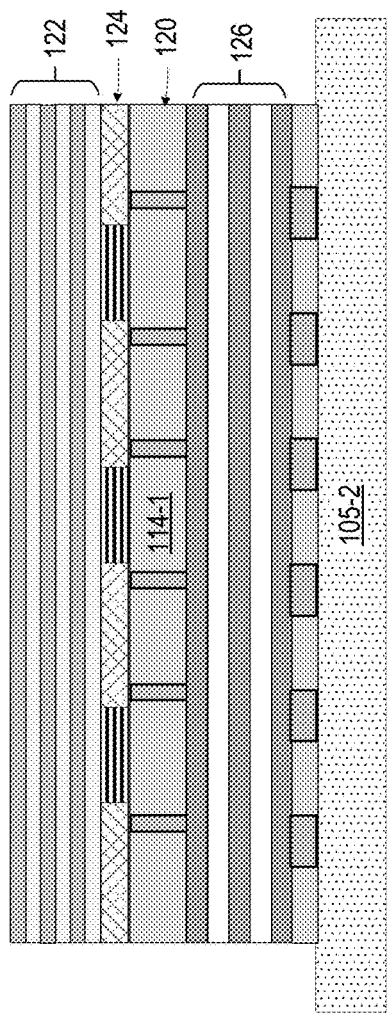

FIG. 8E illustrates an assembly subsequent to inverting the assembly of FIG. 8D and removing the first carrier 105-1.

Figure 8F:
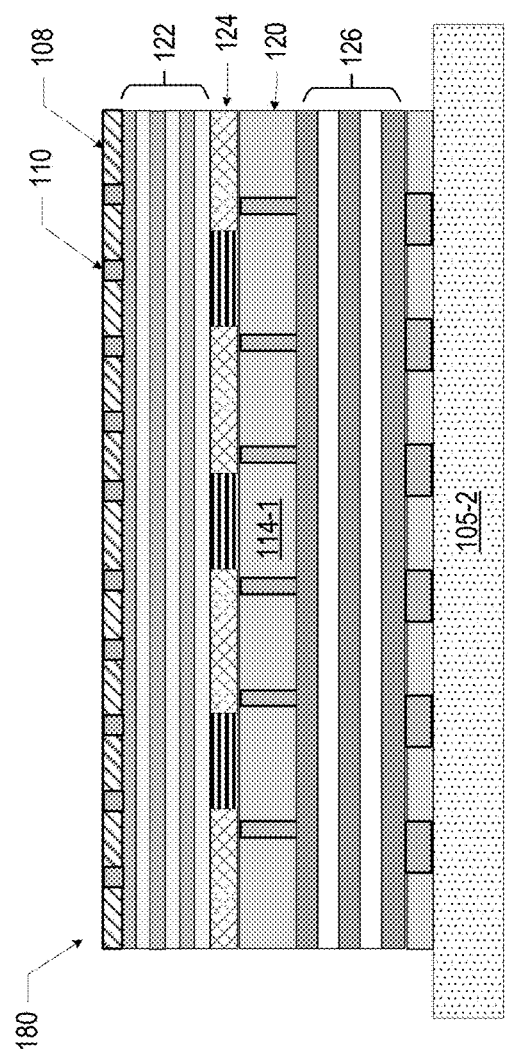

FIG. 8F illustrates an assembly subsequent to forming an exposed HB interface 180 on a top surface of the assembly of FIG. 8E (e.g., on the active side metallization stack 122), where the HB interface 180 includes HB contacts 110 surrounded by HB dielectric 108.

FIG. 8G illustrates an assembly subsequent to hybrid bonding a second die 114-2 to the top surface of the assembly of FIG. 8F. In particular, HB interface 180 (not labeled) of the second die 114-2 may be brought into contact with the HB interface of the first die 114-1, and heat and/or pressure may be applied to bond the contacting HB interfaces 180 to form HB region 130.

FIG. 8H illustrates an assembly subsequent to inverting the assembly of FIG. 8G and removing the second carrier 105-2.

FIG. 8I illustrates an assembly subsequent to forming conductive pillars 152, depositing an insulating material 133 on and around the first die 114-1 and the conductive pillars 152, and forming conductive contacts 132 for DTP interconnects on the top surfaces of the first die 114-1 and the conductive pillars 152. The conductive pillars 152 may be formed using any suitable technique, for example, a lithographic process or an additive process, such as cold spray or 3-dimensional printing. For example, the conductive pillars 152 may be formed by depositing, exposing, and developing a photoresist layer on the top surface of the die 114-2. The photoresist layer may be patterned to form cavities in the shape of the conductive pillars. Conductive material, such as copper, may be deposited in the openings in the patterned photoresist layer to form the conductive pillars 152. The conductive material may be deposited using any suitable process, such as electroplating, sputtering, or electroless plating. The photoresist may be removed to expose the conductive pillars 152. In another example, a photo-imagable dielectric may be used to form the conductive pillars 152. In some embodiments, the insulating material 133 may be initially deposited on and over the top surfaces of the first die 114-1 and the conductive pillars 152, then polished back to expose the top surface of the first die 114-1 and the conductive pillars 152. The insulating material 133 may be formed using any suitable process, including lamination, or slit coating and curing. If the insulating material 133 is formed to completely cover the first die 114-1 and conductive pillars 152, the insulating material 133 may be removed using any suitable technique, including grinding, or etching, such as a wet etch, a dry etch (e.g., a plasma etch), a wet blast, or a laser ablation (e.g., using excimer laser). In some embodiments, the thickness of the insulating material 133 may be minimized to reduce the etching time required. The die 114-1 and/or the die 114-2 may be functionally tested using the conductive contacts 132 to determine that the dies 114-1, 114-2 are KGDs before further processing is performed.

FIG. 8J illustrates an assembly subsequent to inverting the assembly of FIG. 8I. The assembly of FIG. 8J may be a microelectronic assembly 100, as shown, or further manufacturing operations may be performed on the microelectronic assembly 100 of FIG. 8J to form other microelectronic assemblies 100, for example, as shown in FIG. 3. For example, the assembly of FIG. 8J may be electrically coupled to a package substrate through DTP interconnects by printing a solder paste on the conductive contacts 132, placing the assembly of FIG. 8J on a package substrate using a pick-n-place tool, subjecting the solder paste to thermal reflow, and cleaning.

Figure 9C:
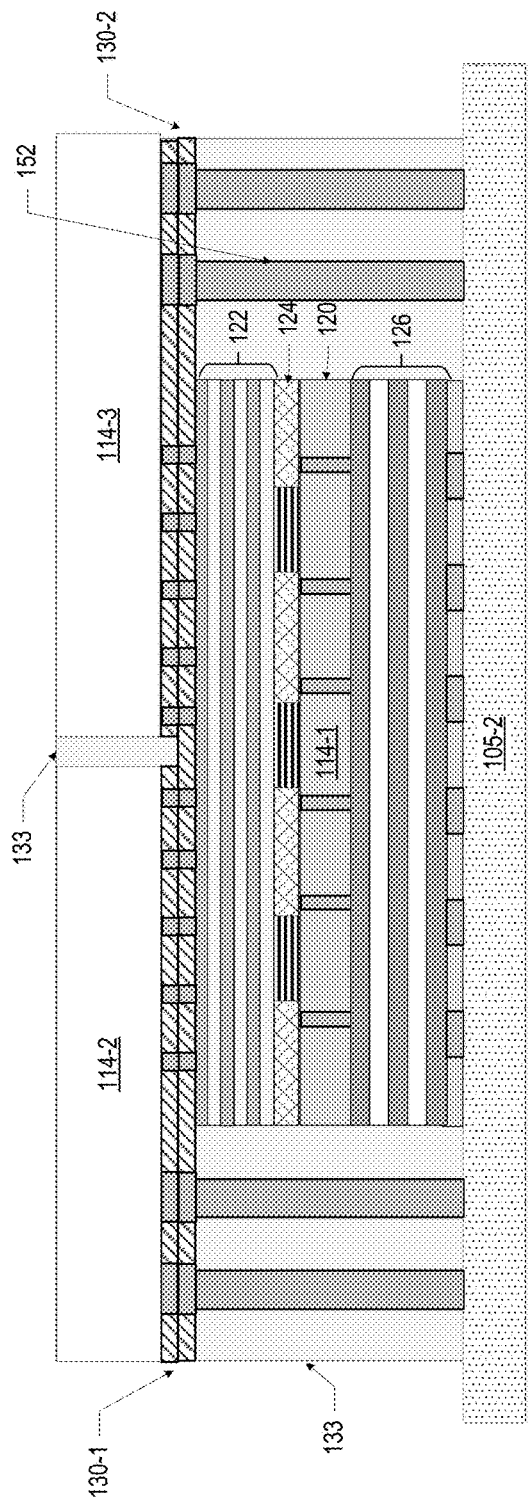

FIGS. 9A-9D are side, cross-sectional views of various stages in an example process for manufacturing the microelectronic assembly of FIG. 1, in accordance with various embodiments. FIG. 9A illustrates the assembly of FIG. 8E subsequent to performing the processes as described above with reference to FIGS. 8A-8E.

FIG. 9B illustrates an assembly subsequent to forming conductive pillars 152 on the second carrier 105-2, depositing an insulating material 133 on and around the first die 114-1 and the conductive pillars 152, and forming an exposed HB interface 180 on a top surface of the insulating material 133, the conductive pillars 152, and the die 114-1 (e.g., on the active side metallization stack 122), where the HB interface 180 includes HB contacts 110 surrounded by HB dielectric 108. The conductive pillars 152 and the insulating material 133 may be formed as described above with reference to FIG. 8I.

FIG. 9C illustrates an assembly subsequent to hybrid bonding a second die 114-2 and a third die 114-3 to the top surface of the assembly of FIG. 9B, and depositing an insulating material 133 on and around the second and third dies 114-2, 114-3. In particular, HB interface 180 (not labeled) of the second die 114-2 and the third die 114-3 may be brought into contact with the HB interface of the first die 114-1 and heat and/or pressure may be applied to bond the contacting HB interfaces 180 to form HB regions 130-1 and 130-2, respectively. The insulating material 133 may be deposited as described above with reference to FIG. 8I. In some embodiments, the insulating material 133 on and around the second and third dies 114-2, 114-3 may be omitted. In such an embodiment, the second and third dies 114-2, 114-3 may be supported by the underlying structure (e.g., the assembly of FIG. 9B). In some embodiments, a mechanical support substrate, such as a permanent carrier (not shown), may be attached to the top surface of the assembly of FIG. 9C (e.g., the top surfaces of the second and third dies 114-2, 114-3) to provide further mechanical support.

Figure 9D:
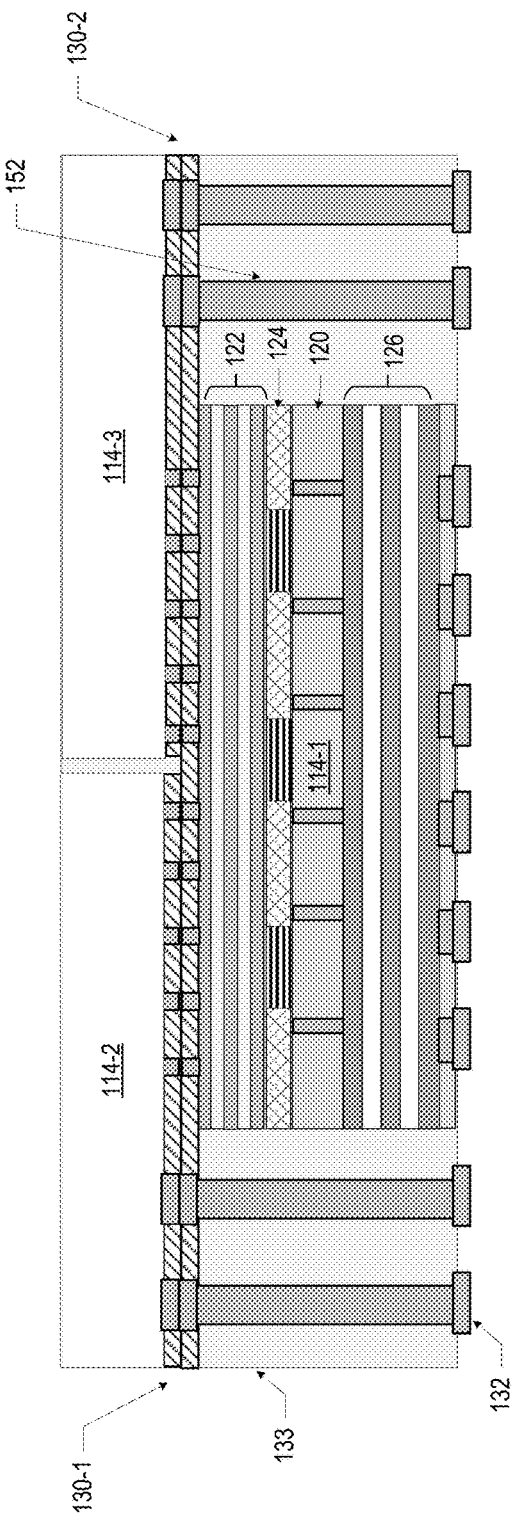

FIG. 9D illustrates an assembly subsequent to removing the second carrier 105-2 and forming conductive contacts 132 for DTP interconnects on a bottom surface of the assembly of FIG. 9C. The dies 114-1, 114-2, 114-3 may be functionally tested using the conductive contacts 132 to determine that the dies 114-1, 114-2, 114-3 are KGDs before further processing is performed. The assembly of FIG. 9D may be a microelectronic assembly 100, as shown, or further manufacturing operations may be performed on the microelectronic assembly 100 of FIG. 9D to form other microelectronic assemblies 100, for example, as shown in FIG. 1. For example, the assembly of FIG. 9D may be electrically coupled to a package substrate through DTP interconnects by printing a solder paste on the conductive contacts 132, placing the assembly of FIG. 9D on a package substrate using a pick-n-place tool, subjecting the solder paste to thermal reflow, and cleaning.

Figure 10A:
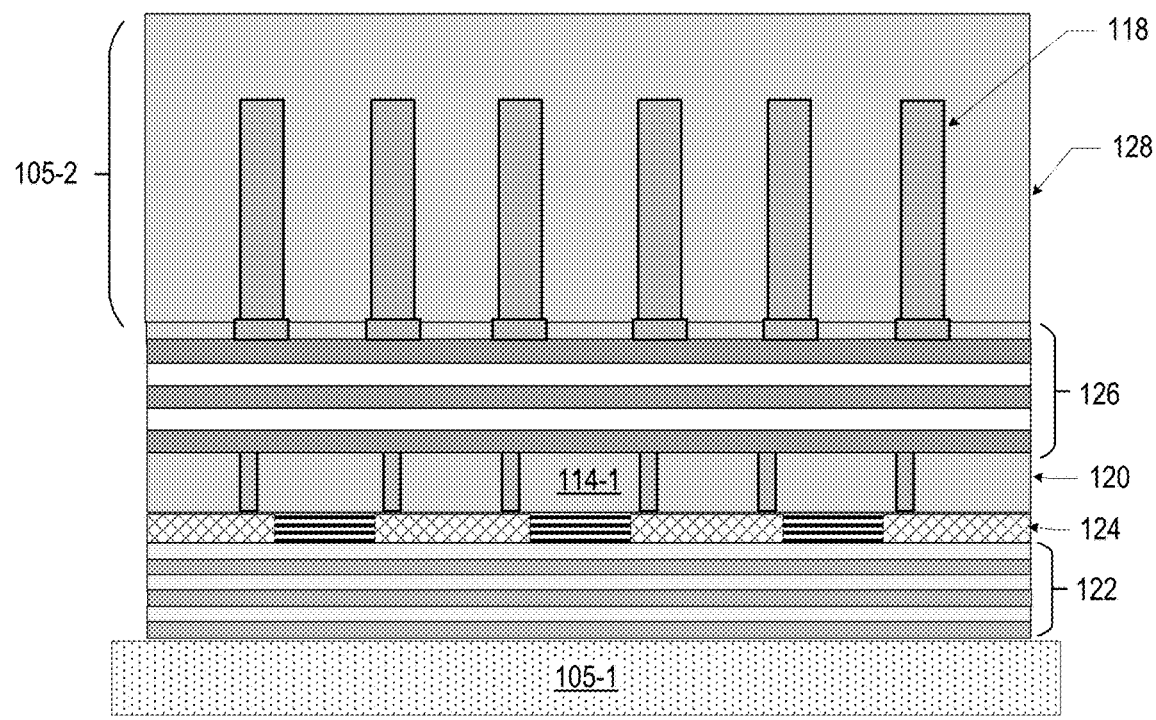

FIGS. 10A-10G are side, cross-sectional views of various stages in an example process for manufacturing the microelectronic assembly of FIG. 5, in accordance with various embodiments. FIG. 10A illustrates an assembly of FIG. 8D subsequent to performing the processes as described above with reference to FIGS. 8A-8D, where the second carrier 105-2 mounted to the top surface includes a substrate 128 and TSVs 118 (e.g., the second carrier 105-2 becomes a permanent part of the microelectronic assembly 100 of FIG. 5).

Figure 10B:
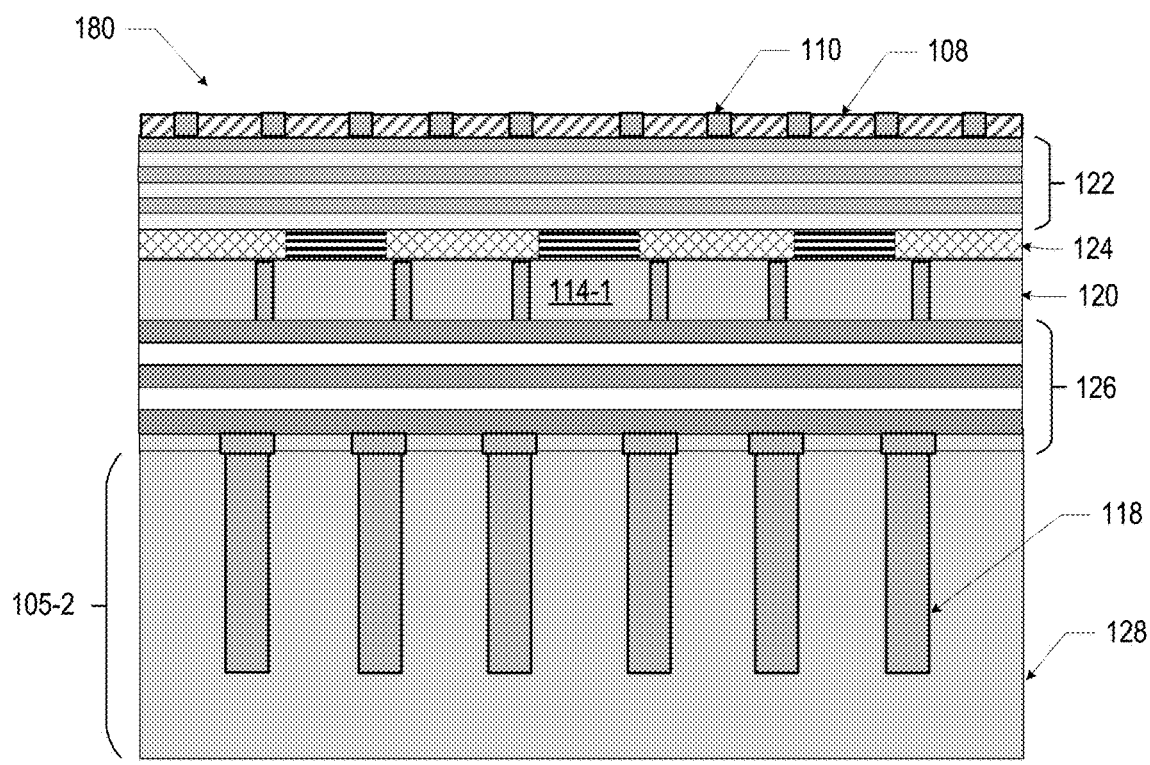

FIG. 10B illustrates an assembly subsequent to inverting the assembly of FIG. 10A, removing the first carrier 105-1, and forming an exposed HB interface 180 on a top surface of the die 114-1 (e.g., on the active side metallization stack 122), where the HB interface 180 includes HB contacts 110 surrounded by HB dielectric 108.

FIG. 10C illustrates an assembly subsequent to placing a second die 114-2 and a third die 114-3 on a third carrier 105-3 with a backside (e.g., non-active side) facing towards the third carrier 105-3. The top surfaces of the second and third dies 114-2, 114-3 may include an exposed HB interface 180-1, 180-2, respectively, where the HB interface 180 includes HB contacts 110 surrounded by HB dielectric 108. In some embodiments, an insulating material 133 (not shown) may be deposited on and around the second and third dies 114-2, 114-3, as described above with reference to FIG. 8I.

FIG. 10D illustrates an assembly subsequent to hybrid bonding the first die 114-1 (e.g., inverting the assembly of FIG. 10B) to the second die 114-2 and the third die 114-3 (e.g., to the top surface of the assembly of FIG. 10C). In particular, HB interface 180 (not labeled) of the first die 114-1 may be brought into contact with the HB interface of the second die 114-2 and the third die 114-3, and heat and/or pressure may be applied to bond the contacting HB interfaces 180 to form HB regions 130-1 and 130-2, respectively.

Figure 10E:
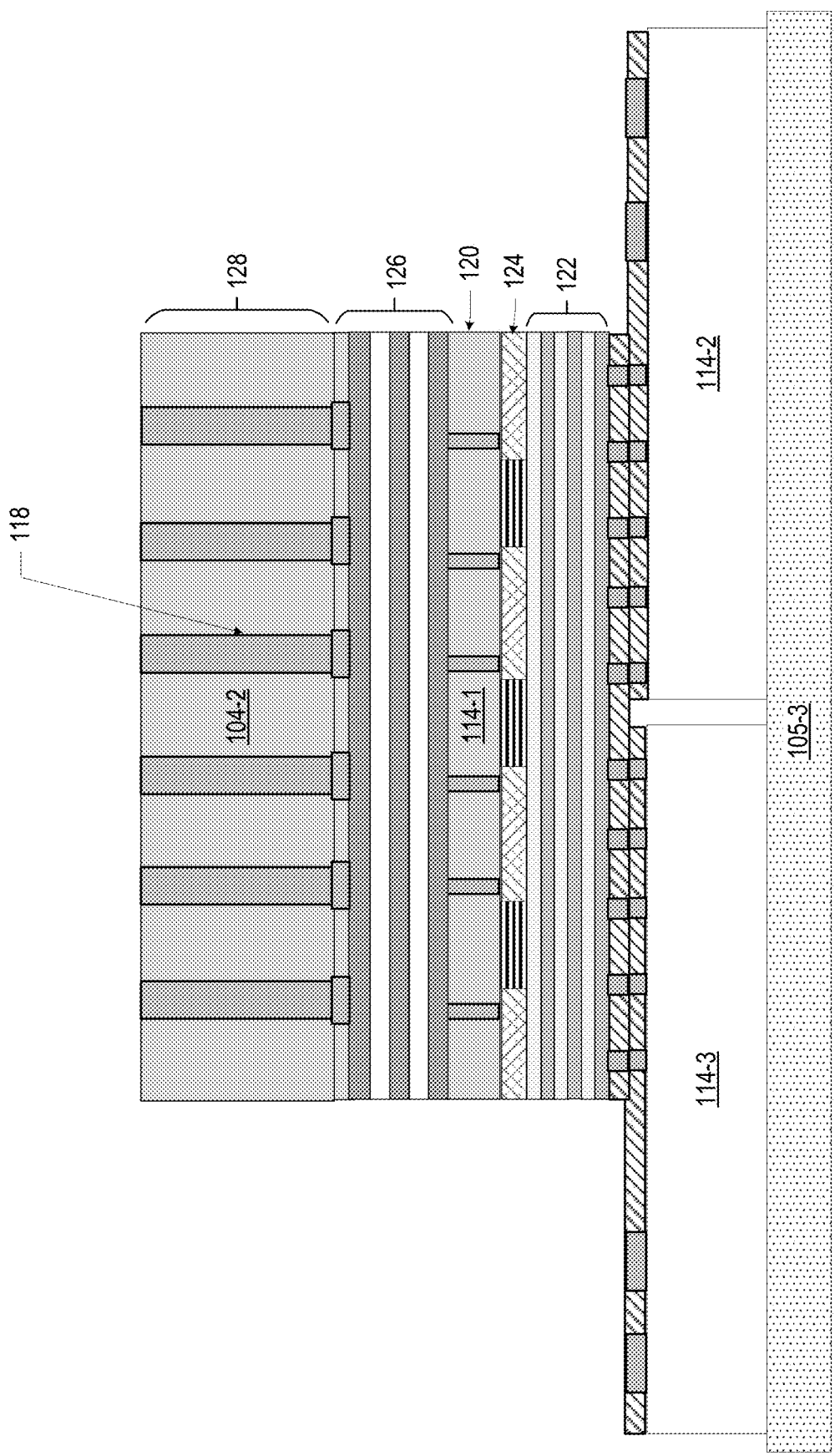

FIG. 10E illustrates an assembly subsequent to removing non-electrical material from the backside (e.g., the top surface) of the substrate 128 and revealing the top surface of the TSVs 118. The non-electrical material may be removed using any suitable technique, including, for example, as described above with reference to FIG. 8B.

Figure 10F:
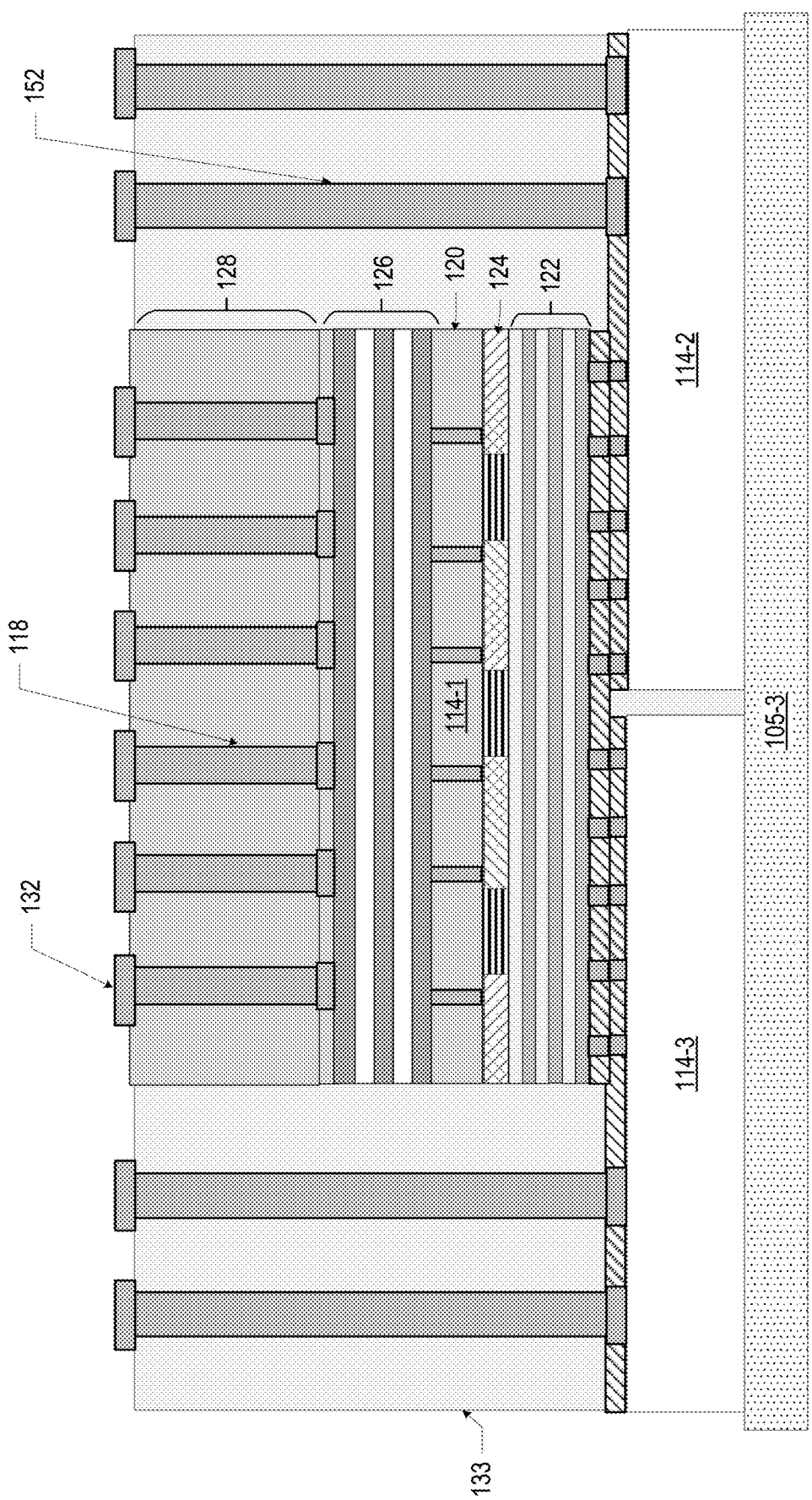

FIG. 10F illustrates an assembly subsequent to forming conductive pillars 152 on the second and third dies 114-2, 114-3, depositing an insulating material 133 on and around the first die 114-1 and the conductive pillars 152, and forming conductive contacts 132 for DTP interconnects on the top surface to the assembly. The dies 114-1, 114-2, 114-3 may be functionally tested using the conductive contacts 132 to determine that the dies 114-1, 114-2, 114-3 are KGDs before further processing is performed. In some embodiments, the insulating material 133 may be deposited on and around the second and third dies 114-2, 114-3.

Figure 10G:
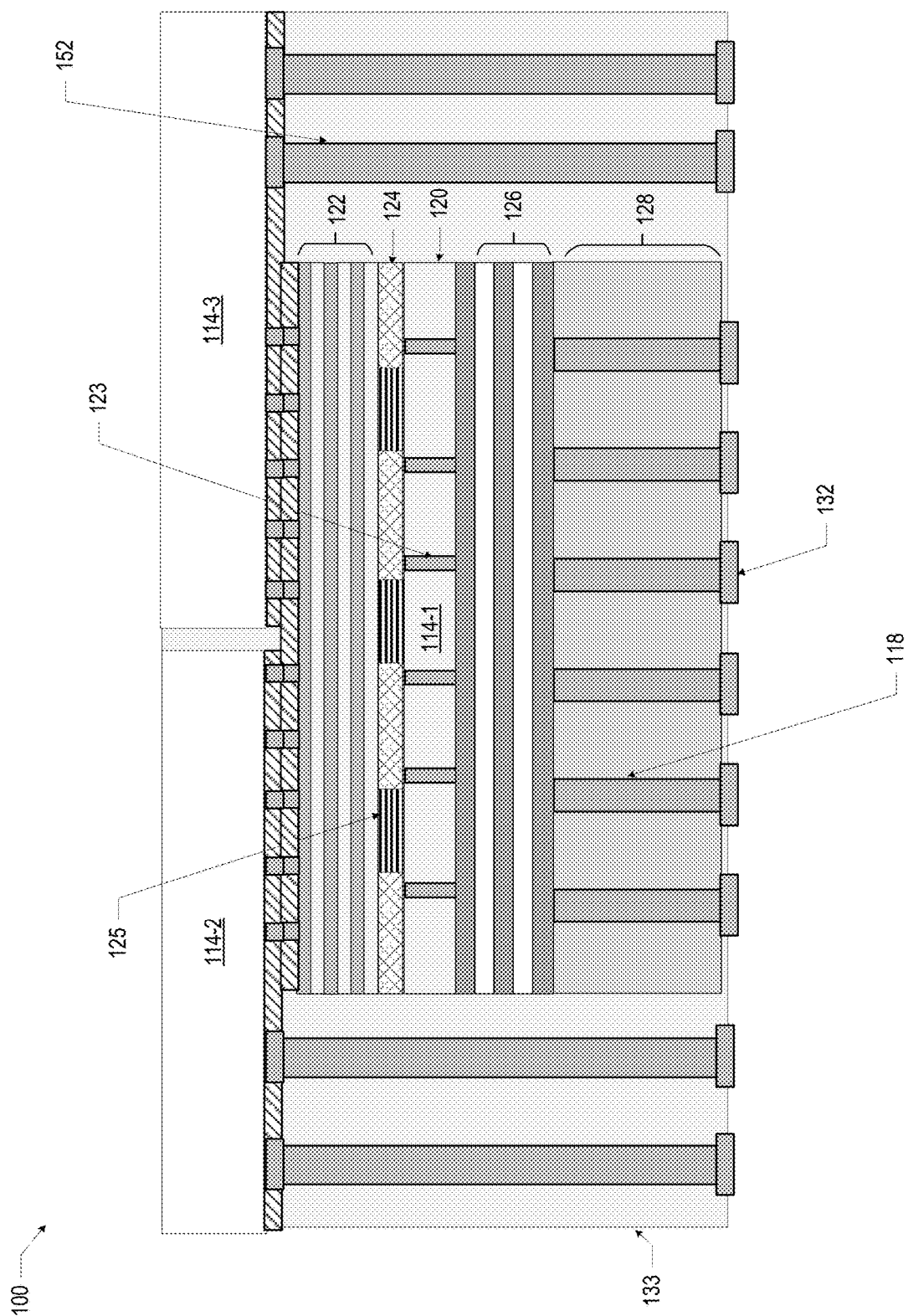

FIG. 10G illustrates an assembly subsequent to inverting the assembly of FIG. 10F and removing the third carrier 105-3. The assembly of FIG. 10G may be a microelectronic assembly 100, as shown, or further manufacturing operations may be performed on the microelectronic assembly 100 of FIG. 10G to form other microelectronic assemblies 100, for example, as shown in FIG. 5. For example, the assembly of FIG. 10G may be electrically coupled to a package substrate through DTP interconnects by printing a solder paste on the conductive contacts 132, placing the assembly of FIG. 10G on a package substrate using a pick-n-place tool, subjecting the solder paste to thermal reflow, and cleaning.

FIGS. 11A-11D are side, cross-sectional views of various stages in an example process for manufacturing the microelectronic assembly of FIG. 7, in accordance with various embodiments.

FIG. 11A is an assembly subsequent to performing the processes described above with reference to FIGS. 10A-10B on first and second dies 114-1, 114-2 and hybrid bonding the first and second dies 114-1, 114-2 to a third die 114-3. In particular, HB interface 180 (not labeled) of the first die 114-1 and the second die 114-2 may be brought into contact with the HB interface of the third die 114-3, and heat and/or pressure may be applied to bond the contacting HB interfaces 180 to form HB regions 130-1 and 130-2, respectively.

FIG. 11B illustrates an assembly subsequent to removing the non-electrical material from the top surface (e.g., backside) of the substrate 128 of the first and second dies 114-1, 114-2 to reveal the top surfaces of the TSVs 118, forming conductive pillars 152 on the top surface of the third die 114-3, and depositing an insulating material 133 on and around the first die 114-1, the second die 114-2, and the conductive pillars 152. In some embodiments, the non-electrical material from the top surface of the substrate 128 of the first and second dies 114-1, 114-2 may be removed with the insulating material 133. The conductive pillars 152 and the insulating material 133 may be formed using any suitable technique, including as described above with reference to FIG. 8I. The insulating material 133 may be removed using any suitable technique, including as described above with reference to FIG. 8I. The non-electrical material of the substrate 128 may be removed using any suitable technique, including as described above with reference to FIG. 8B.

Figure 11C:
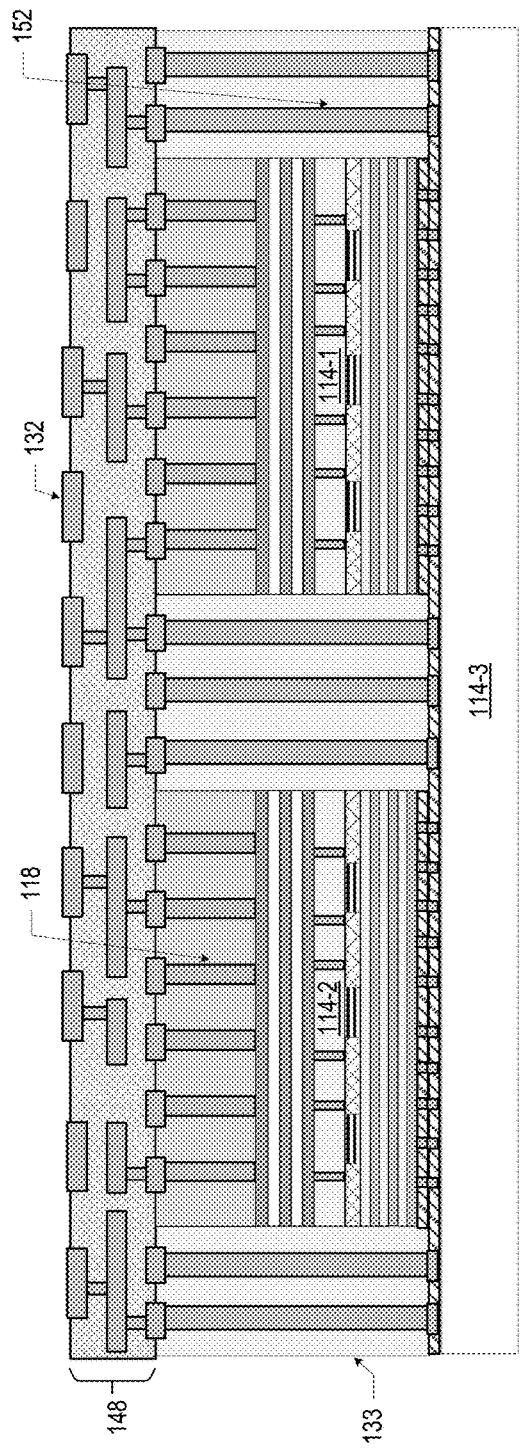

FIG. 11C illustrates an assembly subsequent to forming an RDL 148 on the top surface of the assembly of FIG. 11B. The RDL 148 may include conductive contacts on a bottom surface coupled to the first and second dies 114-1, 114-2 by the TSVs 118 in the substrate 128, and conductive contacts 132 on the top surface for coupling to a package substrate by DTP interconnects. The RDL 148 may be manufactured using any suitable technique, such as a PCB technique, a redistribution layer technique, or damascene processing.

Figure 11D:
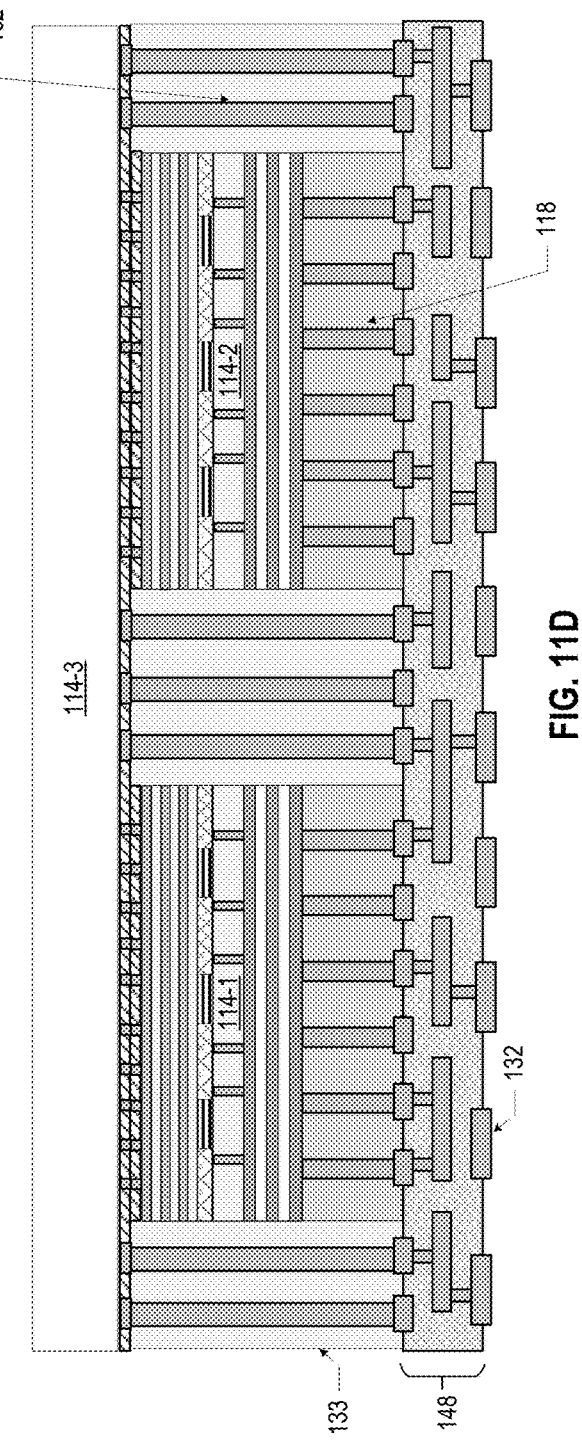

FIG. 11D illustrates an assembly subsequent to inverting the assembly of FIG. 11C. The assembly of FIG. 11D may itself be a microelectronic assembly 100, as shown. Further manufacturing operations may be performed on the microelectronic assembly 100 of FIG. 11D to form other microelectronic assemblies 100, such as shown in FIG. 7. For example, further processing may include depositing a solder resist layer, attaching solder balls, and electrically coupling a package substrate 102 to the bottom surface of the assembly of FIG. 11D through DTP interconnects 150. The dies 114-1, 114-2, 114-3 may be functionally tested using the conductive contacts 132 to determine that the dies 114-1, 114-2, 114-3 are KGDs before further processing is performed.

The microelectronic assemblies 100 disclosed herein may be used for any suitable application. For example, in some embodiments, a microelectronic assembly 100 may be used to enable very small form factor voltage regulation for field programmable gate array (FPGA) or processing units (e.g., a central processing unit, a graphics processing unit, a FPGA, a modem, an applications processor, etc.) especially in mobile devices and small form factor devices. In another example, the die 114 in a microelectronic assembly 100 may be a processing device (e.g., a central processing unit, a graphics processing unit, a FPGA, a modem, an applications processor, etc.).

The microelectronic assemblies 100 disclosed herein may be included in any suitable electronic component. FIGS. 12-15 illustrate various examples of apparatuses that may include, or be included in, any of the microelectronic assemblies 100 disclosed herein.

Figure 12:
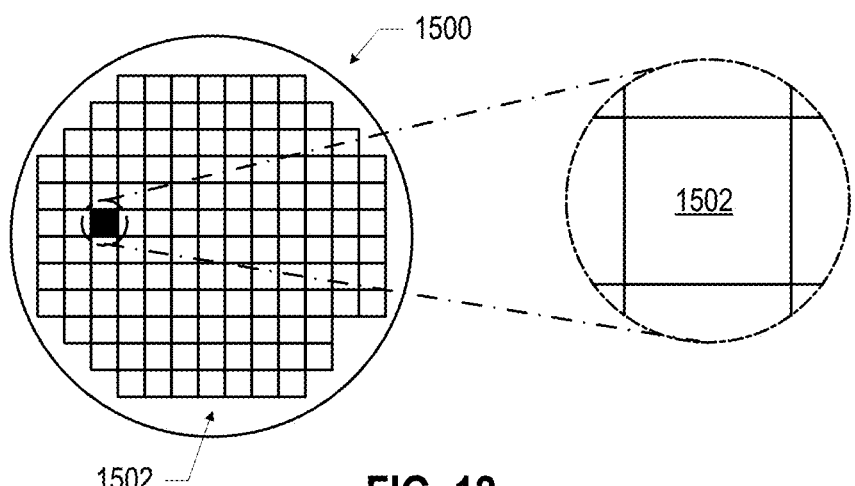
FIG. 12 is a top view of a wafer and dies that may be included in a microelectronic assembly, in accordance with any of the embodiments disclosed herein.

FIG. 12 is a top view of a wafer 1500 and dies 1502 that may be included in any of the microelectronic assemblies 100 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 13, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 15) or other logic that is configured to store information in the memory devices or execute instructions stored in the memory array. In some embodiments, a die 1502 (e.g., a die 114) may be a central processing unit, a radio frequency chip, a power converter, or a network processor. Various ones of the microelectronic assemblies 100 disclosed herein may be manufactured using a die-to-wafer assembly technique in which some dies 114 are attached to a wafer 1500 that include others of the dies 114, and the wafer 1500 is subsequently singulated.

Figure 13:
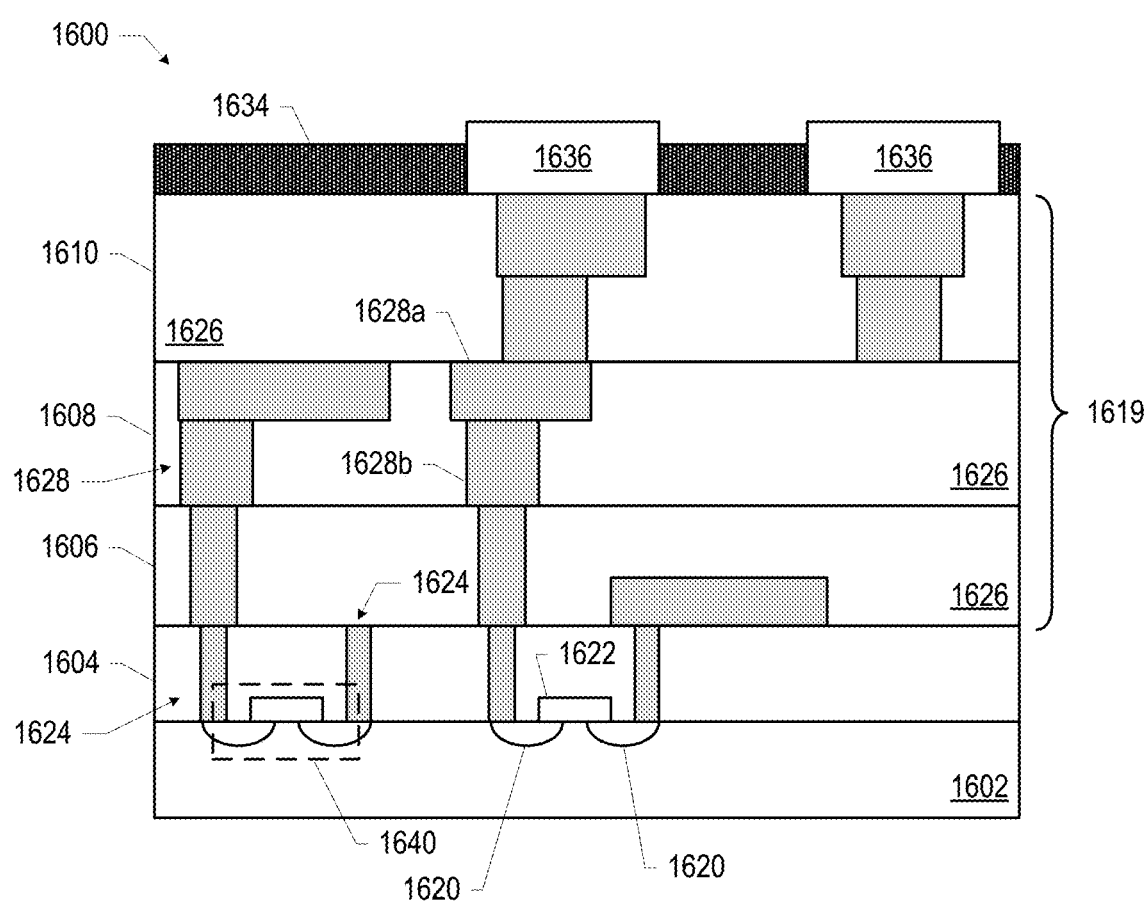
FIG. 13 is a cross-sectional side view of an IC device that may be included in a microelectronic assembly, in accordance with any of the embodiments disclosed herein.

FIG. 13 is a cross-sectional side view of an IC device 1600 that may be included in any of the microelectronic assemblies 100 disclosed herein (e.g., in any of the dies 114). One or more of the IC devices 1600 may be included in one or more dies 1502 (FIG. 12). The IC device 1600 may be formed on a die substrate 1602 (e.g., the wafer 1500 of FIG. 12) and may be included in a die (e.g., the die 1502 of FIG. 12). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 12) or a wafer (e.g., the wafer 1500 of FIG. 12).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 13 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a PMOS or a NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 13 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 13. Although a particular number of interconnect layers 1606-1610 is depicted in FIG. 13, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page from the perspective of FIG. 13. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 13. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 13, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 14:
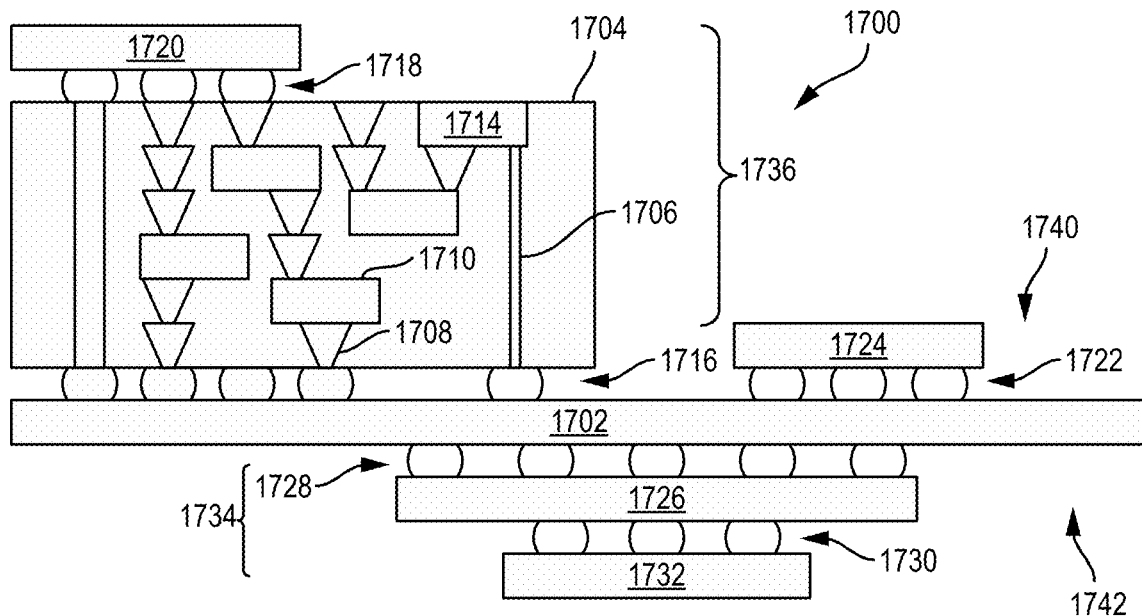
FIG. 14 is a cross-sectional side view of an IC device assembly that may include a microelectronic assembly, in accordance with any of the embodiments disclosed herein.

FIG. 14 is a cross-sectional side view of an IC device assembly 1700 that may include any of the microelectronic assemblies 100 disclosed herein. In some embodiments, the IC device assembly 1700 may be a microelectronic assembly 100. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 14 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 14), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 14, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 12), an IC device (e.g., the IC device 1600 of FIG. 13), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 14, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 14 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 15:
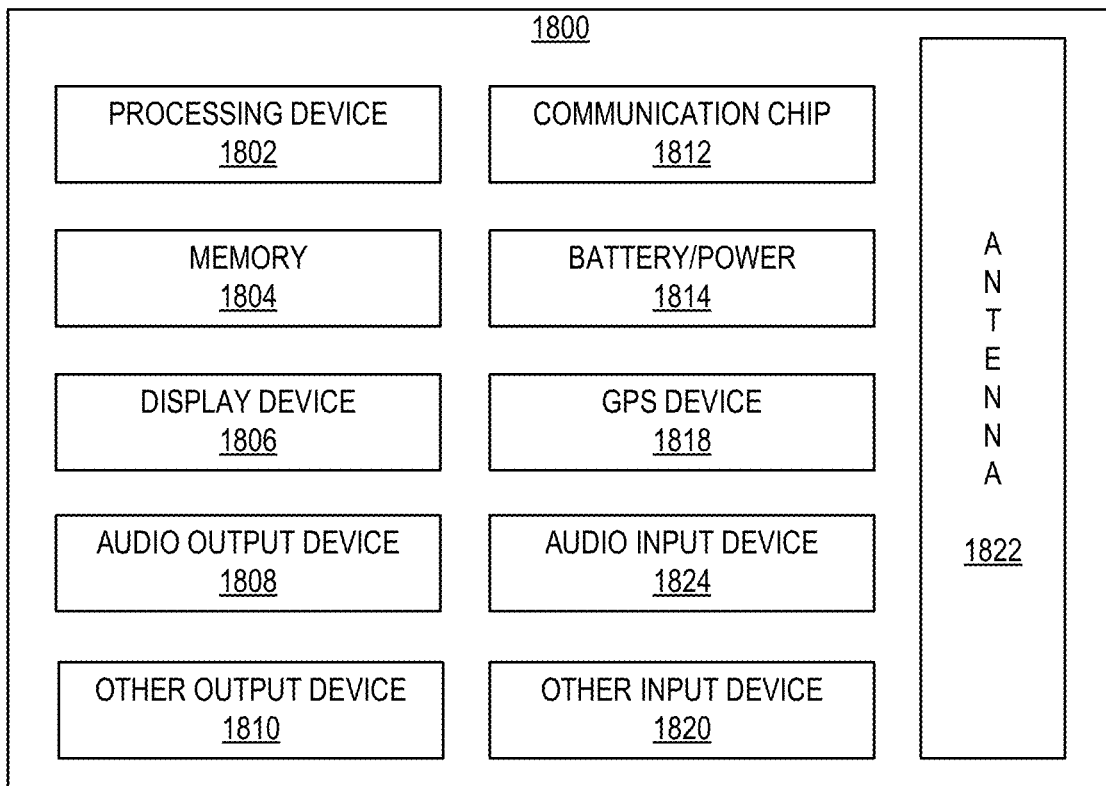
FIG. 15 is a block diagram of an example electrical device that may include a microelectronic assembly, in accordance with any of the embodiments disclosed herein.

FIG. 15 is a block diagram of an example electrical device 1800 that may include one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 15 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 15, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UM B) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a hand-held, portable or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable computing device. In some embodiments, the electrical device 1800 may be any other electronic device that processes data.

The following paragraphs provide various examples of the embodiments disclosed herein.

Example 1 is a microelectronic assembly, including a first die, having a first surface and an opposing second surface, in a first layer, the first die including a first metallization stack at the first surface; a device layer, including a device, on the first metallization stack; a second metallization stack on the device layer; and an interconnect at the first surface electrically coupled to the first metallization stack; a conductive pillar in the first layer; and a second die, having a first surface and an opposing second surface, in a second layer on the first layer, wherein the first surface of the second die is coupled to the second surface of the first die by a hybrid bonding region and is coupled to the conductive pillar.

Example 2 may include the subject matter of Example 1, and may further specify that the hybrid bonding region is a first hybrid bonding region, and may further include a third die, having a first surface and an opposing second surface, in the second layer, wherein the first surface of the third die is coupled to the second surface of the first die by a second hybrid bonding region.

Example 3 may include the subject matter of Example 1 or 2, and may further specify that the interconnect is part of a power delivery network.

Example 4 may include the subject matter of any of Examples 1-3, and may further include a substrate layer, including a micro-through silicon via (μTSV), between the first metallization stack and the device layer.

Example 5 may include the subject matter of Example 4, and may further specify that the μTSV electrically couples the device in the device layer to the first metallization stack.

Example 6 may include the subject matter of any of the Examples 1-5, and may further include a package substrate electrically coupled to the first surface of the first die by the interconnect and electrically coupled to the first surface of the second die by the conductive pillar.

Example 7 may include the subject matter of any of Examples 1-6, and may further specify that the interconnect is a first interconnect, and may further include a third die, having a first surface with a second interconnect and an opposing second surface, electrically coupled to the first surface of the first die by the first interconnect and electrically coupled to the first surface of the second die by the conductive pillar.

Example 8 may include the subject matter of Example 7, and may further specify that the second interconnect is part of a power delivery network.

Example 9 may include the subject matter of Example 7, and may further include a package substrate electrically coupled to the first surface of the third die by the second interconnect.

Example 10 may include the subject matter of any of Examples 1-9, and may further specify that conductive structures of the first metallization stack are thicker than conductive structures of the second metallization stack.

Example 11 is a microelectronic assembly, including a first die, having a first surface and an opposing second surface, in a first layer, the first die including a substrate including a through-substrate via (TSV) at the first surface; a first metallization stack on the substrate; a device layer, including a device, on the first metallization stack; a second metallization stack on the device layer; and an interconnect at the first surface electrically coupled to the first metallization stack by the TSV in the substrate; a conductive pillar in the first layer; and a second die, having a first surface and an opposing second surface, in a second layer on the first layer, wherein the first surface of the second die is coupled to the conductive pillar and to the second surface of the first die by a hybrid bonding region.

Example 12 may include the subject matter of Example 11, and may further specify that the hybrid bonding region is a first hybrid bonding region, and may further include a third die, having a first surface and an opposing second surface, in the second layer, wherein the first surface of the third die is coupled to the second surface of the first die by a second hybrid bonding region.

Example 13 may include the subject matter of Example 11 or 12, and may further specify that the interconnect is part of a power delivery network.

Example 14 may include the subject matter of any of Examples 11-13, and may further specify that the substrate is a first substrate, and may further include a second substrate, including a micro-through silicon via (μTSV), between the first metallization stack and the device layer.

Example 15 may include the subject matter of Example 14, and may further specify that the μTSV electrically couples the device in the device layer to the first metallization stack.

Example 16 may include the subject matter of any of Examples 11-15, and may further include a package substrate electrically coupled to the first surface of the first die by the interconnect and electrically coupled to the first surface of the second die by the conductive pillar.

Example 17 may include the subject matter of any of Examples 11-16, and may further specify that the interconnect is a first interconnect, and may further include a third die, having a first surface with a second interconnect and an opposing second surface, electrically coupled to the first surface of the first die by the first interconnect and electrically coupled to the first surface of the second die by the conductive pillar.

Example 18 may include the subject matter of Example 17, and may further specify that the second interconnect is part of a power delivery network.

Example 19 may include the subject matter of Example 17, and may further include a package substrate electrically coupled to the first surface of the third die by the second interconnect.

Example 20 may include the subject matter of any of Examples 11-19, and may further specify that conductive structures of the first metallization stack are thicker than conductive structures of the second metallization stack.

Example 21 is a microelectronic assembly, including a first die in a first dielectric layer, the first dielectric layer having a first surface and an opposing second surface, and the first die including a substrate including a through-substrate via (TSV) at the first surface; a first metallization stack on the substrate; a device layer, including a device, on the first metallization stack; a second metallization stack on the device layer; and first interconnects at the first surface electrically coupled to the first metallization stack by the TSV in the substrate; a second die in the first dielectric layer, the second die including a substrate including a through-substrate via (TSV) at the first surface; a first metallization stack on the substrate; a device layer, including a device, on the first metallization stack; a second metallization stack on the device layer; and second interconnects at the first surface electrically coupled to the first metallization stack by the TSV in the substrate; a conductive pillar in the first dielectric layer; a third die, in a second dielectric layer on the second surface of the first dielectric layer, electrically coupled to the conductive pillar, electrically coupled to the first die by a first hybrid bonding region at the second surface of the first dielectric layer, and electrically coupled to the second die by a second hybrid bonding region at the second surface of the first dielectric layer; and a redistribution layer (RDL), having a first surface and an opposing second surface, at the first surface of the first dielectric layer, wherein the second surface of the RDL is electrically coupled to the first surface of the first dielectric layer, and wherein the first surface of the RDL includes third interconnects electrically coupled to the conductive pillar, the first interconnects, and the second interconnects by conductive pathways in the RDL.

Example 22 may include the subject matter of Example 21, and may further specify that the first interconnects, the second interconnects, and the third interconnects are part of a power delivery network.

Example 23 may include the subject matter of Example 21 or 22, and may further specify that the substrate of the first die is a first substrate, and may further include a second substrate, including a micro-through silicon via (µTSV), between the first metallization stack and the device layer, wherein the µTSV electrically couples the device in the device layer to the first metallization stack.

Example 24 may include the subject matter of any of Examples 21-23, and may further specify that the substrate of the second die is a first substrate, and may further include a second substrate, including a µTSV, between the first metallization stack and the device layer, wherein the µTSV electrically couples the device in the device layer to the first metallization stack.

Example 25 may include the subject matter of any of Examples 21-24, and may further include a package substrate electrically coupled to the first surface of the RDL by the third interconnects.

The invention claimed is:

1. A microelectronic assembly, comprising:
    a first die, having a first surface and an opposing second surface, in a first layer, the first die including:
        a first metallization stack at the first surface;
        a device layer, including a device, on the first metallization stack;
        a second metallization stack on the device layer; and
        an interconnect at the first surface electrically coupled to the first metallization stack;
    a conductive pillar in the first layer; and
    a second die, having a first surface and an opposing second surface, in a second layer on the first layer, wherein the first surface of the second die is coupled to the second surface of the first die by a hybrid bonding region and is coupled to the conductive pillar.

2. The microelectronic assembly of claim 1, wherein the hybrid bonding region is a first hybrid bonding region, and further comprising:
    a third die, having a first surface and an opposing second surface, in the second layer, wherein the first surface of the third die is coupled to the second surface of the first die by a second hybrid bonding region.

3. The microelectronic assembly of claim 1, wherein the interconnect is part of a power delivery network.

4. The microelectronic assembly of claim 1, further comprising:
    a substrate layer, including a micro-through silicon via (µTSV), between the first metallization stack and the device layer.

5. The microelectronic assembly of claim 4, wherein the µTSV electrically couples the device in the device layer to the first metallization stack.

6. The microelectronic assembly of claim 1, further comprising:
    a package substrate electrically coupled to the first surface of the first die by the interconnect and electrically coupled to the first surface of the second die by the conductive pillar.

7. The microelectronic assembly of claim 1, wherein conductive structures of the first metallization stack are thicker than conductive structures of the second metallization stack.

8. A microelectronic assembly, comprising:
    a first die, having a first surface and an opposing second surface, in a first layer, the first die including:
        a substrate including a through-substrate via (TSV) at the first surface;
        a first metallization stack on the substrate;
        a device layer, including a device, on the first metallization stack;
        a second metallization stack on the device layer; and
        an interconnect at the first surface electrically coupled to the first metallization stack by the TSV in the substrate;
    a conductive pillar in the first layer; and
    a second die, having a first surface and an opposing second surface, in a second layer on the first layer, wherein the first surface of the second die is coupled to the conductive pillar and to the second surface of the first die by a hybrid bonding region.

9. The microelectronic assembly of claim 8, wherein the interconnect is part of a power delivery network.

10. The microelectronic assembly of claim 8, wherein the substrate is a first substrate, and further comprising:
    a second substrate, including a micro-through silicon via (µTSV), between the first metallization stack and the device layer.

11. The microelectronic assembly of claim 10, wherein the µTSV electrically couples the device in the device layer to the first metallization stack.

12. The microelectronic assembly of claim 8, further comprising:
    a package substrate electrically coupled to the first surface of the first die by the interconnect and electrically coupled to the first surface of the second die by the conductive pillar.

13. The microelectronic assembly of claim 8, further comprising:
    a third die, having a first surface and an opposing second surface, wherein the second surface of the third die is electrically coupled to the first surface of the first die by the interconnect and electrically coupled to the first surface of the second die by the conductive pillar.

14. The microelectronic assembly of claim 13, wherein the first surface of the third die further includes a second interconnect, and the microelectronic assembly further comprises:
    a package substrate electrically coupled to the first surface of the third die by the second interconnect.

15. The microelectronic assembly of claim 14, wherein the second interconnect is part of a power delivery network.

16. The microelectronic assembly of claim 8, wherein conductive structures of the first metallization stack are thicker than conductive structures of the second metallization stack.

17. A microelectronic assembly, comprising:
    a first die in a first dielectric layer, the first dielectric layer having a first surface and an opposing second surface, and the first die including:
        a substrate including a through-substrate via (TSV) at the first surface;

a first metallization stack on the substrate;
a device layer, including a device, on the first metallization stack;
a second metallization stack on the device layer; and
first interconnects at the first surface electrically coupled to the first metallization stack by the TSV in the substrate;
a second die in the first dielectric layer, the second die including:
a substrate including a through-substrate via (TSV) at the first surface;
a first metallization stack on the substrate;
a device layer, including a device, on the first metallization stack;
a second metallization stack on the device layer; and
second interconnects at the first surface electrically coupled to the first metallization stack by the TSV in the substrate;
a conductive pillar in the first dielectric layer;
a third die, in a second dielectric layer on the second surface of the first dielectric layer, electrically coupled to the conductive pillar, electrically coupled to the first die by a first hybrid bonding region at the second surface of the first dielectric layer, and electrically coupled to the second die by a second hybrid bonding region at the second surface of the first dielectric layer; and a redistribution layer (RDL), having a first surface and an opposing second surface, at the first surface of the first dielectric layer, wherein the second surface of the RDL is electrically coupled to the first surface of the first dielectric layer, and wherein the first surface of the RDL includes third interconnects electrically coupled to the conductive pillar, the first interconnects, and the second interconnects by conductive pathways in the RDL.

18. The microelectronic assembly of claim 17, wherein the first interconnects, the second interconnects, and the third interconnects are part of a power delivery network.

19. The microelectronic assembly of claim 17, wherein the substrate of the first die is a first substrate, and further comprising:
a second substrate, including a micro-through silicon via (µTSV), between the first metallization stack and the device layer, wherein the µTSV electrically couples the device in the device layer to the first metallization stack.

20. The microelectronic assembly of claim 17, further comprising:
a package substrate electrically coupled to the first surface of the RDL by the third interconnects.

* * * * *